(12) United States Patent
Katakura

(10) Patent No.: US 10,276,661 B2
(45) Date of Patent: Apr. 30, 2019

(54) SEMICONDUCTOR DEVICE

(71) Applicant: FUJI ELECTRIC CO., LTD., Kawasaki (JP)

(72) Inventor: Hideaki Katakura, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 14/691,098

(22) Filed: Apr. 20, 2015

(65) Prior Publication Data
US 2015/0357463 A1 Dec. 10, 2015

(30) Foreign Application Priority Data

Jun. 9, 2014 (JP) .................................. 2014-118729

(51) Int. Cl.
| | | |
|---|---|---|
| H01L 29/06 | (2006.01) | |
| H01L 29/40 | (2006.01) | |
| H01L 29/66 | (2006.01) | |
| H01L 29/78 | (2006.01) | |
| H01L 29/417 | (2006.01) | |

(52) U.S. Cl.
CPC ...... H01L 29/0696 (2013.01); H01L 29/0638 (2013.01); H01L 29/402 (2013.01); H01L 29/404 (2013.01); H01L 29/41758 (2013.01); H01L 29/66659 (2013.01); H01L 29/7835 (2013.01)

(58) Field of Classification Search
CPC ............. H01L 29/1095; H01L 29/0638; H01L 29/41758; H01L 29/402; H01L 29/404; H01L 29/0696; H01L 29/7835; H01L 29/66659

See application file for complete search history.

(56) References Cited

U.S. PATENT DOCUMENTS

| | | | | |
|---|---|---|---|---|
| 5,440,160 | A | * 8/1995 | Vinal | ................ H01L 21/26586 257/327 |
| 6,784,490 | B1 | * 8/2004 | Inoue | .............. H01L 21/823814 257/344 |
| 2004/0075147 | A1 | 4/2004 | Ueda et al. | |
| 2008/0290407 | A1 | * 11/2008 | Kusunoki | ........... H01L 27/0611 257/334 |

FOREIGN PATENT DOCUMENTS

| | | |
|---|---|---|
| JP | 7-288328 | 10/1995 |
| JP | 2003-324159 | 11/2009 |

* cited by examiner

*Primary Examiner* — Dale E Page
*Assistant Examiner* — Quovaunda Jefferson

(57) ABSTRACT

A semiconductor device includes: a channel-forming region of a first conductivity type; a first main electrode region of a second conductivity type disposed in a portion of an upper part of the channel-forming region; a drift region of the second conductivity type that is disposed in an upper part of the channel-forming region apart from the first main electrode region; a second main electrode region of the second conductivity type that is disposed in a part of an upper part of the drift region; and a stopper region of the second conductivity type that is disposed at an end region of the drift region apart from the first main electrode region and has a higher concentration than the drift region. The stopper region restricts extension of a depletion layer developing at the boundary of the pn junction between the channel-forming region and the drift region.

16 Claims, 13 Drawing Sheets

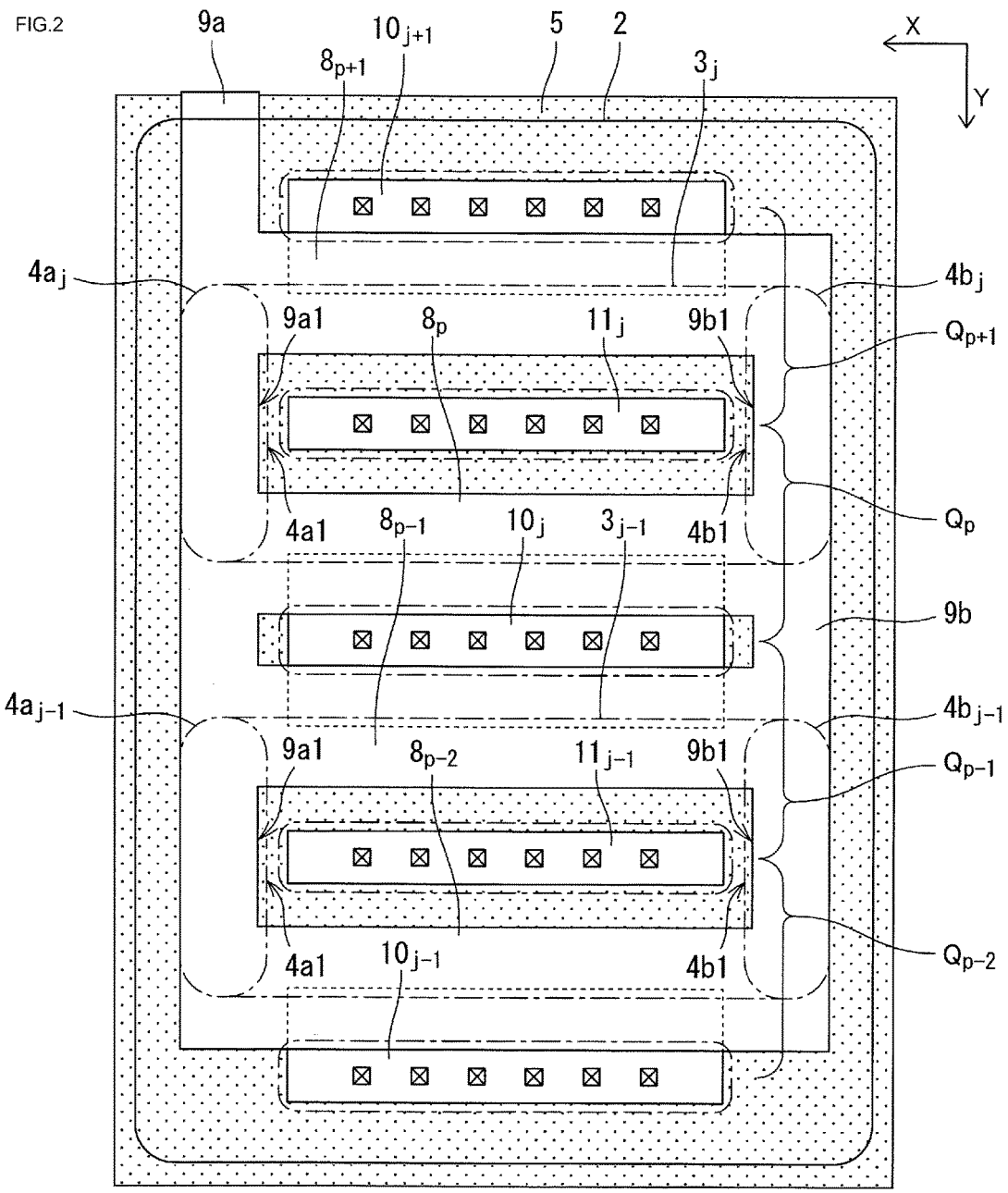

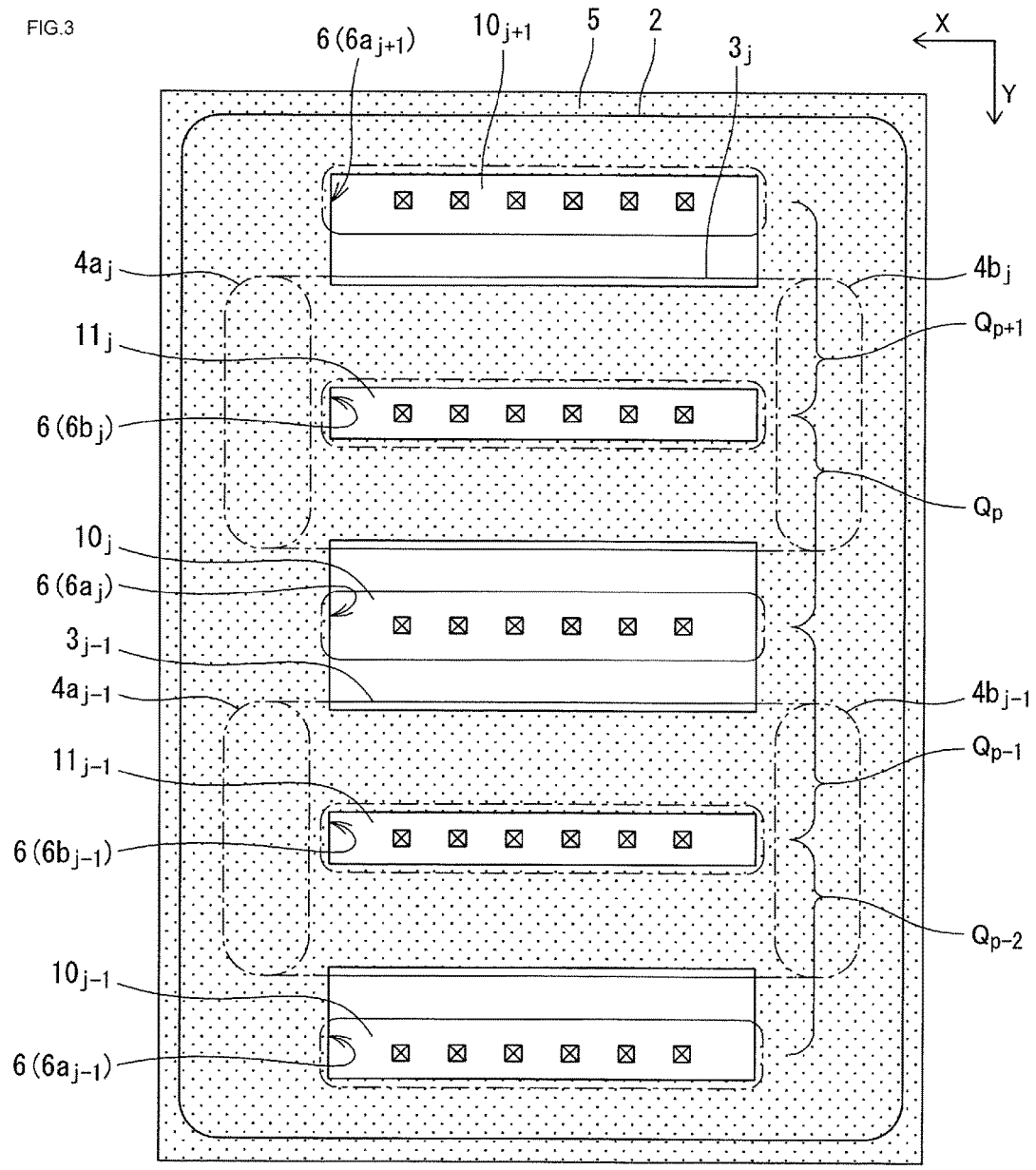

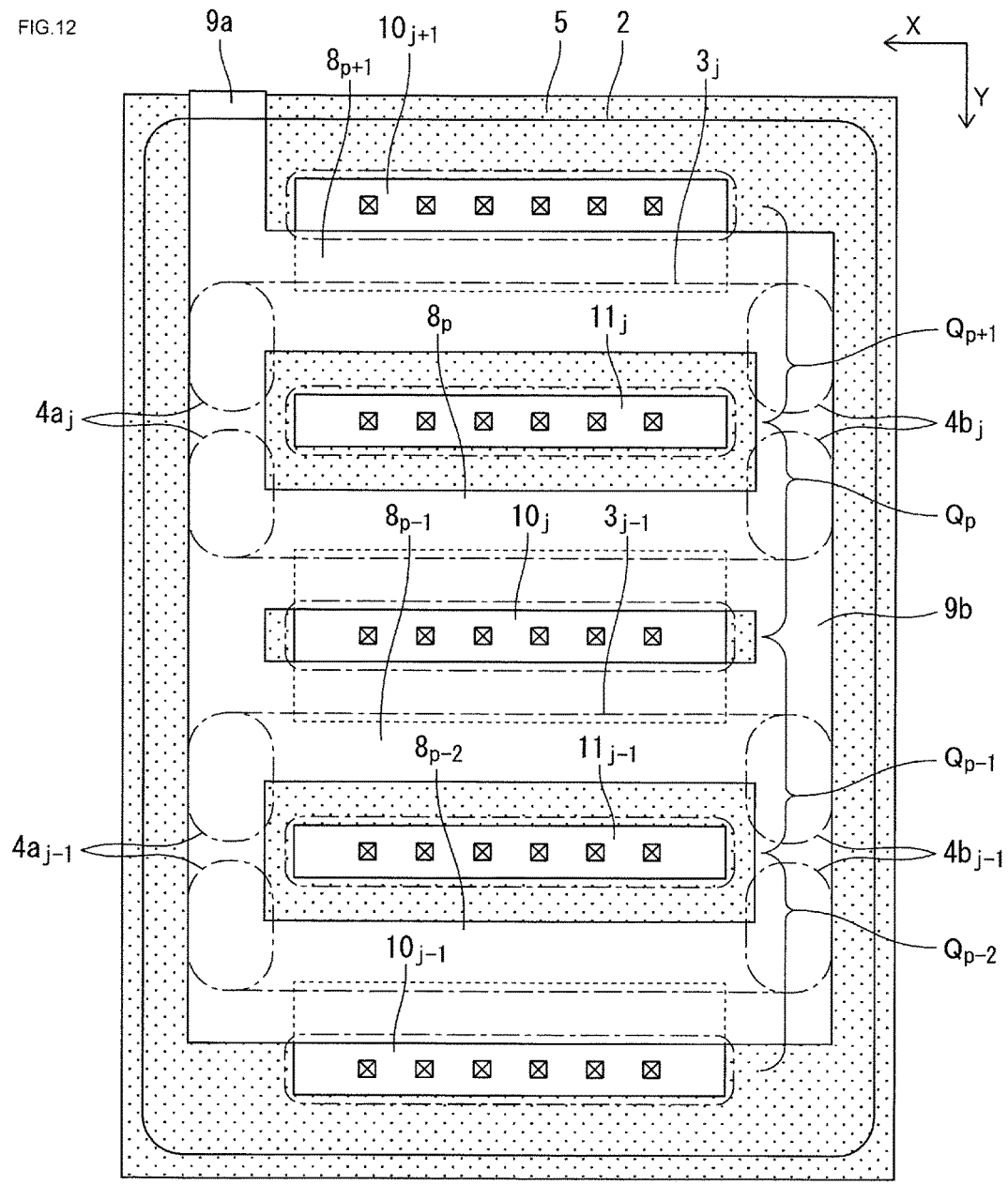

SEMICONDUCTOR DEVICE

CROSS-REFERENCE TO RELATED APPLICATIONS

This application is based on, and claims priority to Japanese Patent Application No. 2014-118729, filed on Jun. 9, 2014, the content of which is incorporated herein by reference in its entirety.

BACKGROUND

1. Field

The present disclosure relates to a semiconductor device, and in particular to a technology effective in application to a semiconductor device integrated with field effect transistors having an offset gate structure.

2. Description of Related Art

A lateral power MOSFET, for example, is known as a power transistor used in a power amplifier circuit, a power supply circuit, a converter, or a power supply protection circuit. Japanese Unexamined Patent Application Publication No. 2003-324159 discloses a lateral power MOSFET in which high electric field relaxation for achieving a high withstand voltage is performed by forming a field insulation film in the drain region side of a gate electrode and forming an offset region, or a drift region, with a lower impurity concentration than the drain region around the drain region.

Japanese Unexamined Patent Application Publication No. H07-288328 discloses relaxation of electric field concentration arising at a boundary between an offset region and a drain region when a depletion layer generated at the boundary of the pn junction between a channel forming region and the offset region extends, by an enhanced impurity concentration at the boundary between the offset region and the drain region.

A lateral power MOSFET has a layout in which a plurality of source regions and drain regions alternately arranged along the gate length direction, which is the direction transverse to the longitudinal direction, of a gate electrode. This arrangement is aimed at reducing an area of the device by sharing the drain region in a construction with a large channel width in order to decrease ON resistance. A gate electrode is disposed between the source region and the drain region. Each of the plurality of gate electrodes is connected together with a gate interconnection extending on a field insulation film along the transverse direction of the gate electrode at a place outside the source region and the drain region.

As to the electric field concentration arising at the offset region and at the drain region, JP H07-288328 fails to mention about the case arising only at a part of a semiconductor device due to a field plate effect of the gate interconnection.

SUMMARY

One aspect of the present invention is to address the problems in conventional technologies and provide a semiconductor device that ensures a device withstand voltage and achieves downsizing.

To address the above mentioned problems, a semiconductor device of an aspect of the present invention comprises: a channel-forming region of a first conductivity type; a first main electrode region of a second conductivity type disposed in a part of an upper part of the channel-forming region; a drift region of the second conductivity type disposed in an upper part of the channel-forming region apart from the first main electrode region, through the drift region running carriers from the first main electrode region; a second main electrode region of the second conductivity type disposed in a part of an upper part of the drift region and receiving the carriers from the first main electrode region; and a stopper region of the second conductivity type with higher impurity concentration than the drift region, disposed at an end of the drift region apart from the first main electrode region; wherein the stopper region obstructs extension of a depletion layer at a pn junction between the channel-forming region and the drift region.

A semiconductor device of embodiments of the present invention ensures a device withstand voltage between a channel forming region and a second main electrode region, and achieves down-sizing.

Additional aspects and/or advantages will be set forth in part in the description which follows and, in part, will be apparent from the description, or may be learned by practice of the invention.

BRIEF DESCRIPTION OF THE DRAWINGS

These and/or other aspects and advantages will become apparent and more readily appreciated from the following description of the embodiments, taken in conjunction with the accompanying drawings of which:

FIG. 2 is a plan view showing a state having the first metallic line and the second metallic line removed FIG. 3 is a plan view showing a state having the gate interconnection and the gate electrode removed;

FIG. 12 is a plan view showing a first variation of a semiconductor device according to an embodiment of the present invention.

DESCRIPTION OF EMBODIMENTS

Figure 1:
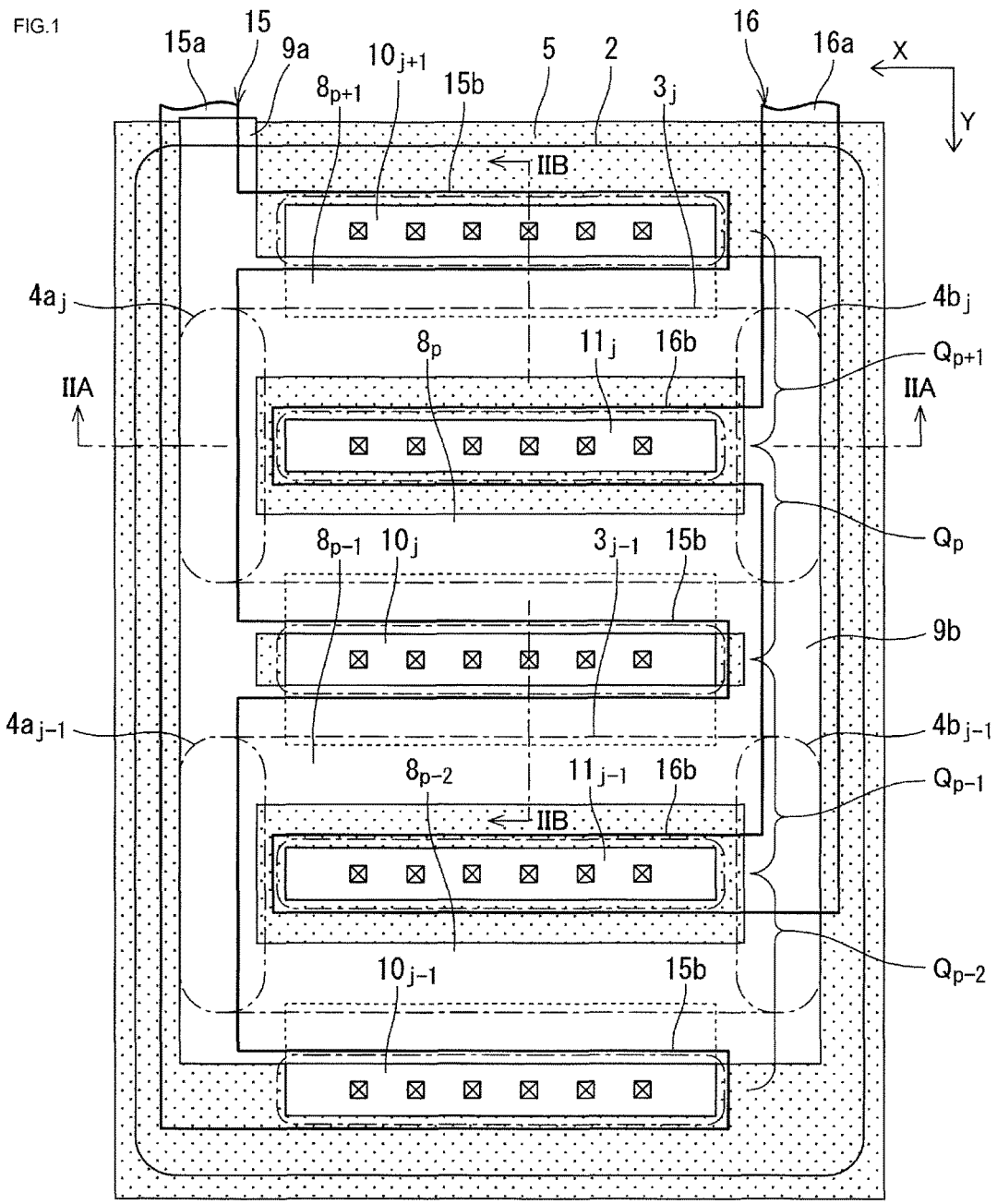
FIG. 1 is a schematic plan view of an essential part of a semiconductor device according to an embodiment of the present invention.

Reference will now be made in detail to the embodiments, examples of which are illustrated in the accompanying drawings, wherein like reference numerals refer to the like elements throughout. The embodiments are described below to explain the present invention by referring to the figures.

Further down-sizing is demanded in power transistors, too. The lateral power MOSFET mentioned earlier can be down-sized by disposing the gate inter-connection extending on the field insulation film nearly to the drain region.

However, the present inventor has found that a device withstand voltage, which is a withstand voltage between a channel forming region and a drain region, degrades when the distance between the gate inter-connection and the drain region is decreased to 1 µm or smaller. This degradation of a withstand voltage arises due to electric field concentration at an edge at the gate interconnection side of the drain region caused by extension of depletion layer generated at the boundary of a pn junction between the channel forming region and the drain region under the gate interconnection to the drain region promoted by a field plate effect of the gate interconnection on the field insulation film.

Thus, the present inventor paid attention to the drift region, or an offset region, under the gate interconnection and accomplished the present invention.

The following describes in detail a semiconductor device according to an embodiment of the present invention with reference to the accompanying drawings.

In this specification, "a main electrode region" means a low resistivity semiconductor region of either one of a source region or a drain region in a field effect transistor (FET). The main electrode region means a semiconductor region of either one of an emitter region or a collector region in the case of an IGBT. Thus, the main electrode region is a name depending on the type of a semiconductor device. More specifically, the "one main electrode region" can be defined as "a first main electrode region" and "the other main electrode region" can be defined as "a second main electrode region." Thus, "a second main electrode region" is a semiconductor region of either one of a source region or a drain region that is not a first main electrode region in an FET or an SIT, and "a second main electrode region" is a semiconductor region of either one of an emitter region or a collector region that is not a first main electrode region in an IGBT. Since the following description is made on a lateral MOSFET, a source region is called "a first main electrode region" and a drain region is called "a second main electrode region."

In the following description of the embodiment example, a first conductivity type is a p type and a second conductivity type is an n type for an example. But, the conductivity type can be exchanged so that a first conductivity type is an n type and a second conductivity type is a p type.

In this specification and the accompanying drawings, a layer or a region preceded by the letter n or p means a layer with a majority carrier of electrons or positive holes, respectively. The symbols "+" and "−" suffixed to the letter "p" or "n" mean higher or lower impurity concentration, respectively, than a semiconductor region without the symbols.

In this specification and the accompanying drawings, a similar construction is given the same symbol and description thereon is omitted.

The accompanying drawings used for illustrating the embodiment example are not depicted in an accurate scale or a correct relative dimensions in order for easy observation and understanding. The present invention is not limited to the embodiment example described in the following within the spirit of the invention.

In the embodiment example in the following, a representative example of a semiconductor device of the invention is a lateral MOSFET. In the embodiment example in the following description, "an X direction" and "a Y direction" are first and second directions perpendicular to each other in the same plane. In FIGS. 1 through 3, and FIG. 12, the horizontal direction is defined as an X direction and the vertical direction is defined as a Y direction. In FIG. 4A, FIGS. 8A, 9A, 10A, and 11A, the horizontal direction is defined as an X direction; and in FIG. 4B, FIGS. 8B, 9B, 10B, and 11B, the horizontal direction is defined as a Y direction. In FIG. conductive plug 13, the horizontal direction is defined as an X direction.

As shown in FIGS. 1, 2, 3, 4A and 4B, the semiconductor device according to the embodiment example of the present invention is a lateral MOSFET mainly composed of a semiconductor substrate 1 of a second conductivity type, which is an n⁻ type in the example, made of a single crystalline silicon, for example. The semiconductor device according to the embodiment of the invention has a construction composed of a plurality of transistor cells $Q_{p-2}$, $Q_{p-1}$, $Q_p$, and $Q_{p+1}$ with a fine structure formed on a principal surface of a semiconductor substrate 1 and connected in parallel to obtain a high power. Although FIG. 1, FIG. 2, and FIG. 3 each shows four transistor cells $Q_{p-2}$, $Q_{p-1}$, $Q_p$, and $Q_{p+1}$ integrated, the number of transistor cells Q is not limited to four.

The transistor cell $Q_p$ is mainly composed of a channel-forming region 2 of a first conductivity type (p type), a gate insulation film 7, a gate electrode $8_p$, a first main electrode region $10_j$, or a source region, of a second conductivity type (n type), a second main electrode region $11_j$, or a drain region, of a second conductivity type (n type), and a drift region $3_j$, or an offset region, of an second conductivity type (n type).

The transistor cell $Q_{p+1}$ is mainly composed of a channel-forming region 2, a gate insulation film 7, a gate electrode $8_{p+1}$, a first main electrode region $10_{j+1}$, or a source region, of a second conductivity type (n type), a second main electrode region $11_j$, or a drain region, of a second conductivity type (n type), and a drift region $3_j$, or an offset region, of an second conductivity type (n type).

The transistor cell $Q_{p-1}$ is mainly composed of a channel-forming region 2, a gate insulation film 7, a gate electrode $8_{p-1}$, a first main electrode region $10_j$, or a source region, a second main electrode region $11_{j-1}$, or a drain region, of a second conductivity type (n type), and a drift region $3_{j-1}$, or an offset region, of a second conductivity type (n type).

The transistor cell $Q_{p-2}$ is mainly composed of a channel-forming region 2, a gate insulation film 7, a gate electrode $8_{p-2}$, a first main electrode region $10_{j-1}$, or a source region, of an n type, a second main electrode region $11_{j-1}$, or a drain region, of a second conductivity type (n type), and a drift region $3_{j-1}$.

The semiconductor device according to the embodiment of the invention, as shown in FIGS. 1, 2, 3, 4A, and 4B, shares the second main electrode region $11_j$ and drift region $3_j$ with the transistor cells $Q_p$ and $Q_{p-1}$, and shares the first main electrode region $10_j$ with the transistor cells $Q_{p-1}$ and $Q_p$. The semiconductor device according to the embodiment of the invention, as shown in FIGS. 1, 2, 3, shares the second main electrode region $11_{j-1}$ and the drift region $3_{j-1}$ with the transistor cells $Q_{p-2}$ and $Q_{p-1}$.

In the transistor cells $Q_p$ and $Q_{p+1}$, the carriers from the first main electrode regions $10_j$ and $10_{j+1}$ run through the drift region 3, and are delivered to the second main electrode region $11_j$.

Likewise, in the transistor cells $Q_{p-2}$ and $Q_{p-1}$, the carriers from the first main electrode regions $10_{j-1}$ and $10_j$ run through the drift region $3_{j-1}$ and are delivered to the second main electrode region $11_{j-1}$.

As shown in FIGS. 1, 2, 3, 4A, and 4B, a field insulation film 5 is formed on the principal surface of the semiconductor substrate 1. This field insulation film 5 is formed with a silicon dioxide film that is produced by oxidizing the principal surface of the semiconductor substrate 1 by means of selected oxidation method. The field insulation film 5 mainly performs electric insulation isolation between semiconductor device elements and between main electrode regions.

The field insulation film 5 extends along the X direction in a shape of stripes, and is formed in a shape of a ladder having a plurality of windows 6 arranged periodically in the Y direction perpendicular to the X direction on one plane. The plurality of windows 6 include windows $6a_{j-1}$, $6a_j$, $6a_{j+1}$ for first main electrode regions and windows $6b_{j-1}$ and $6b_j$ for second main electrode regions, which are periodically arranged alternately in the Y direction.

The windows $6a_j$ and $6a_{j+1}$ for first main electrode regions with a stripe shape are arranged with a certain distance from the window $6b_j$ for second main electrode region in the Y direction perpendicular to the X direction, which is the longitudinal direction of the window $6b_j$ for second main electrode region with a stripe shape, interposing the window $6b_j$ for a second main electrode region.

The windows $6a_{j-1}$ and $6a_j$ for first main electrode regions are arranged with a certain distance from the window $6b_{j-1}$ for second main electrode region in the Y direction perpendicular to the X direction, which is the longitudinal direction of the window $6b_{j-1}$ for second main electrode region with a stripe shape, interposing the window $6b_{j-1}$ for a second main electrode region.

The channel-forming region 2 is disposed in the upper part of the principal surface side of the semiconductor substrate 1. The first main electrode regions $10_{j-1}$, $10_j$, and $10_{j+1}$ are disposed at parts of the upper region of the channel-forming region 2 in the upper part of the principal surface side of the semiconductor substrate 1. The drift regions $3_{j-1}$ and $3_j$ are disposed in the upper part of the channel-forming region 2 apart from the first main electrode regions $10_{j-1}$, $10_j$ and $10_{j+1}$. The second main electrode regions $11_{j-1}$ and $11_j$ are disposed at the upper part of the drift regions $3_{j-1}$ and $3_j$, respectively.

The drift region $3_j$ is disposed in the upper part of the channel-forming region 2 between the window $6a_j$ and the window $6a_{j+1}$ for the first main electrode regions and extends along the peripheral region of the window $6b_j$ for the second main electrode region from the window $6b_j$ side of the second main electrode region to the region beneath the field insulation film 5. Similarly, the drift region $3_{j-1}$ is disposed in the upper part of the channel-forming region 2 between the window $6a_{j-1}$ and the window $6aj$ for the first main electrode regions and extends along the peripheral region of the window $6b_{j-1}$ for the second main electrode region from the window $6b_{j-1}$ side of the second main electrode region to the region beneath the field insulation film 5. The drift region $3_{j-1}$ and the drift region $3_j$ are formed with the form of stripes along the X-direction in the form of islands in the upper part of the channel-forming region 2.

The first main electrode region $10_j$ is disposed in the upper part of the channel-forming region 2 in the window $6aj$ for first main electrode region apart from the drift regions $3_{j-1}$ and $3_j$. The first main electrode region $10_j$ is disposed at the central position in the Y direction perpendicular to the longitudinal direction of the window $6aj$ for first main electrode region.

The first main electrode region $10_{j+1}$ is disposed in the upper part of the channel-forming region 2 in the window $6a_{j+1}$ for first main electrode region apart from the drift region $3_j$. The first main electrode region $10_{j+1}$ is disposed at the position deviated from the center of the window $6a_{j+1}$ for first main electrode region away from the drift region $3_j$ in the Y direction perpendicular to the longitudinal direction of the window $6a_{j+1}$ for first main electrode region.

The first main electrode region $10_{j-1}$ is disposed in the upper part of the channel-forming region 2 in the window $6a_{j-1}$ for first main electrode region apart from the drift region $3_{j-1}$. The first main electrode region $10_{j-1}$ is disposed at the position deviated from the center of the window $6a_{j+1}$ for first main electrode region away from the drift region $3_{j-1}$ in the Y direction perpendicular to the longitudinal direction of the window $6a_{j-1}$ for first main electrode region. The first main electrode regions $10_{j-1}$, $10_j$, and $10_{j+1}$ are formed with a shape of stripes along the X direction and disposed in a configuration of islands in the upper part of the channel-forming region 2.

The second main electrode region $11_j$ is disposed at the center of the drift region $3_j$ in the window $6b_j$ for second main electrode region. The second main electrode region $11_j$ is formed in whole the region of the window $6b_j$ for second main electrode region. The second main electrode region $11_j$ has a planar size in which the periphery thereof is positioned outside the perimeter of the window $6b_j$ for second main electrode region.

The second main electrode region $11_{j-1}$ is disposed at the center of the drift region $3_{j-1}$ in the window $6b_{j-1}$ for second main electrode region. The second main electrode region $11_{j-1}$ is formed in whole the region of the window $6b_{j-1}$ for second main electrode region. The second main electrode region $11_{j-1}$ has a planar size in which the periphery thereof is positioned outside the perimeter of the window $6b_{j-1}$ for second main electrode region. The second main electrode regions $11_{j-1}$ and $11_j$ are formed in a shape of stripes along the X direction and disposed with a configuration of islands in the upper region of the drift regions $3_{j-1}$ and $3_j$.

A gate insulation film 7 is formed on the principal surface of the semiconductor substrate 1. The gate insulation film 7 is provided on the channel-forming region 2 between the drift region $3_j$ and the first main electrode region $10_j$, and between the drift region $3_j$ and the first main electrode region $10_{j+1}$. The gate insulation film 7 is provided on the channel-forming region 2 between the drift region $3_{j-1}$ and the first main electrode region $10_j$, and between the drift region $3_{j-1}$ and the first main electrode region first main electrode region $10_{j-1}$. The gate insulation films 7 are arranged in every other windows of the plurality of windows 6 in the field insulation film 5 in the Y direction. Second main electrode regions $11_{j-1}$ and $11_j$ are disposed in the windows 6 where the gate insulation films 7 are not disposed.

The gate insulation film 7 is composed of a silicon dioxide ($SiO_2$) film formed on the surface of the semiconductor substrate 1 by means of thermal oxidation process, for example. The gate insulation film 7 can employ a silicon oxide film, a silicon nitride ($Si_3N_4$) film, or a lamination of these films produced by a chemical vapor deposition (CVD) method as well as the thermal oxidation method. For power semiconductor devices requiring high withstand voltage, however, the silicon oxide film produced by the thermal oxidation method is preferable because it provides an advantage of compactness.

The embodiment of the invention is described in the case of the transistor cells $Q_{p-2}$, $Q_{p-1}$, $Q_p$, and $Q_{p+1}$ that are FETs of a MOS type with the gate insulation film of an oxide film. However, the transistor cells can be FETs of a MIS type with a gate insulation film of a silicon nitride film, or a laminated films of a silicon oxide film and silicon nitride film, as well as a silicon oxide film.

As shown in FIG. 2, the gate electrodes $8_{p-2}$, $8_{p-1}$, $8_p$, and $8_{p+1}$ have a planar pattern of stripes along the X direction. As shown in FIG. 4B, the gate electrodes $8_{p-2}$, $8_{p-1}$, $8_p$, and $8_{p+1}$ are formed on the channel-forming region 2 intercalating the gate insulation film 7 between the gate electrode and the channel-forming region 2 so that a channel is formed beneath the stripe part extending along the X direction, which is the gate width direction. The gate electrodes $8_{p-2}$, $8_{p-1}$, $8_p$, and $8_{p+1}$ are formed, for example, of a doped polysilicon layer with a low resistivity containing impurities.

A channel is formed on the surface of the channel-forming region 2 beneath the gate electrodes $8_{p-2}$, $8_{p-1}$, $8_p$, and $8_{p+1}$, which are stripes in the X direction, controlled by the voltage applied to the gate electrodes $8_{p-2}$, $8_{p-1}$, $8_p$, and $8_{p+1}$. Through the channels beneath the gate electrodes $8_p$ and $8_{p+1}$ and the drift region $3_j$, carriers move from the first main electrode regions $10_j$ and $10_{j+1}$ to the second main electrode region $11_j$. Through the channels beneath the gate electrodes $8_{p-2}$ and $8_{p-1}$ and the drift region $3_{j-1}$, charges move from the first main electrode regions $10_{j-1}$ and $10_j$ to the second main electrode region $11_{j-1}$.

As shown in FIGS. 1, 2, 3, 4A, and 4B, the gate electrode $8_p$ is disposed on the field insulation film 5 and the gate insulation film 7 between the first main electrode region $10_j$ and the second main electrode region $11_j$. The gate electrode $8_{p+1}$ is disposed on the field insulation film 5 and the gate insulation film 7 between the first main electrode region $10_{j+1}$ and the second main electrode region $11_j$. The gate electrode $8_{p-2}$ is disposed on the field insulation film 5 and the gate insulation film 7 between the first main electrode region $10_{j-1}$ and the second main electrode region $11_{j-1}$. The gate electrode $8_{p-2}$ is disposed on the field insulation film 5 and the gate insulation film 7 between the first main electrode region $10_{j-1}$ and the second main electrode region $11_{j-1}$. Thus, the gate electrodes $8_{p-2}$, $8_{p-1}$, $8_p$, and $8_{p+1}$ are arranged for the parts thereof in the side of the second main electrode region $11_{j-1}$ and the side of the second main electrode region $11_j$ to ride on the field insulation film 5.

The first main electrode regions $10_{j-1}$, $10_j$, $10_{j+1}$ and the drift region $3_{j-1}$ and $3_j$ are disposed in the both sides, in the direction of gate length, which is the Y direction, of the gate electrodes $8_{p-2}$, $8_{p-1}$, $8_p$, and $8_{p+1}$ apart from each other. The drift regions $3_{j-1}$ and $3_j$ are disposed in the upper part of the channel-forming region 2 around the second main electrode regions $11_{j-1}$ and $11_j$. The drift regions $3_{j-1}$ and $3_j$ are formed with a lower impurity concentration than the second main electrode regions $11_{j-1}$ and $11_j$.

The first main electrode regions $10_{j-1}$, $10_j$, $10_{j+1}$ are arranged periodically in the upper part of the channel-forming region 2. On the other hand, the second main electrode regions $11_{j-1}$ and $11_j$, different from the first main electrode regions $10_{j-1}$, $10_j$, $10_{j+1}$, are arranged in the central region of the upper part of the drift region $3_{j-1}$ and $3_j$, which are disposed in the upper part of the channel-forming region 2.

As shown in FIG. 2, the semiconductor device according to the embodiment of the present invention has a layout that arranges the first main electrode regions $10_{j-1}$, $10_j$, and $10_{j+1}$, which are source regions, and the second main electrode regions $11_{j-1}$ and $11_j$, which are drain regions, alternately and periodically in the direction of gate length, which is the Y direction, of the gate electrodes $8_{p-2}$, $8_{p-1}$, $8_p$, and $8_{p+1}$. It is intended by this arrangement that the area of the power device is reduced by sharing the second main electrode regions $11_{j-1}$ and $11_j$, which are drain regions, in the construction with a large channel width, which is a length in the X direction, for the purpose of lowering the ON resistance. In the construction of the semiconductor device of the embodiment example, the gate electrodes $8_{p-2}$, $8_{p-1}$, $8_p$, and $8_{p+1}$ are each disposed between the first main electrode region $10_{j-1}$ and the second main electrode region $11_{j-1}$, between the first main electrode region $10_j$ and the second main electrode region $11_{j-1}$, and between the first main electrode region $10_j$ and the second main electrode region $11_j$, and between the first main electrode region $10_{j+1}$ and the second main electrode region $11_j$. The gate electrodes $8_{p-2}$, $8_{p-1}$, $8_p$, and $8_{p+1}$ are connected together with first gate interconnection 9a and second gate interconnection 9b to construct a ladder structure, as described later.

As shown in FIGS. 1, 2, 4A, and 4B, the semiconductor device according to the embodiment of the present invention has the drift region $3_j$ disposed in the region under the adjacent pair of gate electrodes $8_p$ and $8_{p+1}$ and under the region between the gate electrodes $8_p$ and $8_{p+1}$ out of the gate electrodes $8_{p-2}$, $8_{p-1}$, $8_p$, and $8_{p+1}$. The drift region $3_{j-1}$ is disposed in the region under the adjacent pair of gate electrodes $8_{p-2}$ and $8_{p-1}$ and under the region between the gate electrodes $8_{p-2}$ and $8_{p-1}$ out of the gate electrodes $8_{p-2}$, $8_{p-1}$, $8_p$, and $8_{p+1}$.

As shown in FIGS. 1, 2, 4A, and 4B, one end in the longitudinal direction of each of the gate electrodes $8_{p-2}$, $8_{p-1}$, $8_p$, and $8_{p+1}$ is connected together with a surface interconnection of first gate interconnection 9a extending in the Y direction on the field insulation film 5. The other end in the longitudinal direction of each of the gate electrodes $8_{p-2}$, $8_{p-1}$, $8_p$, and $8_{p+1}$ is connected together with a surface interconnection of second gate interconnection 9b extending in the Y direction on the field insulation film 5. The first gate interconnection 9a and second gate interconnection 9b are formed in the same layer as the gate electrodes $8_{p-2}$, $8_{p-1}$, $8_p$, and $8_{p+1}$. The first gate interconnection 9a and second gate interconnection 9b are disposed at the positions with a shorter distance from the second main electrode regions $11_{j-1}$ and $11_j$ as compared with the distance in the conventional lateral MOSFETs for the purpose of downsizing the power device. The first gate interconnection 9a is supplied with the voltage to be applied to the gate electrodes $8_{p-2}$, $8_{p-1}$, $8_p$, and $8_{p+1}$; the second gate interconnection 9b is supplied with the same voltage as the one to the first gate interconnection 9a.

Figure 4A:
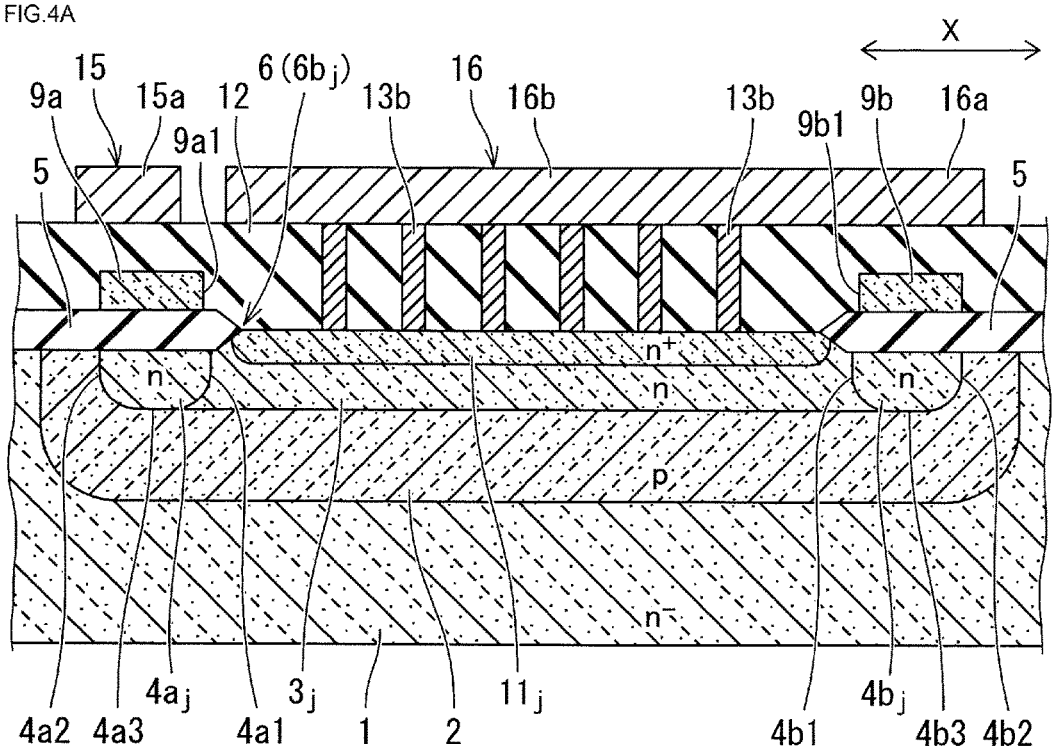
FIG. 4A is a schematic sectional view showing a sectional construction along the line IIA-IIA in FIG. 1 of a semiconductor device according to an embodiment of the present invention.
Figure 4B:
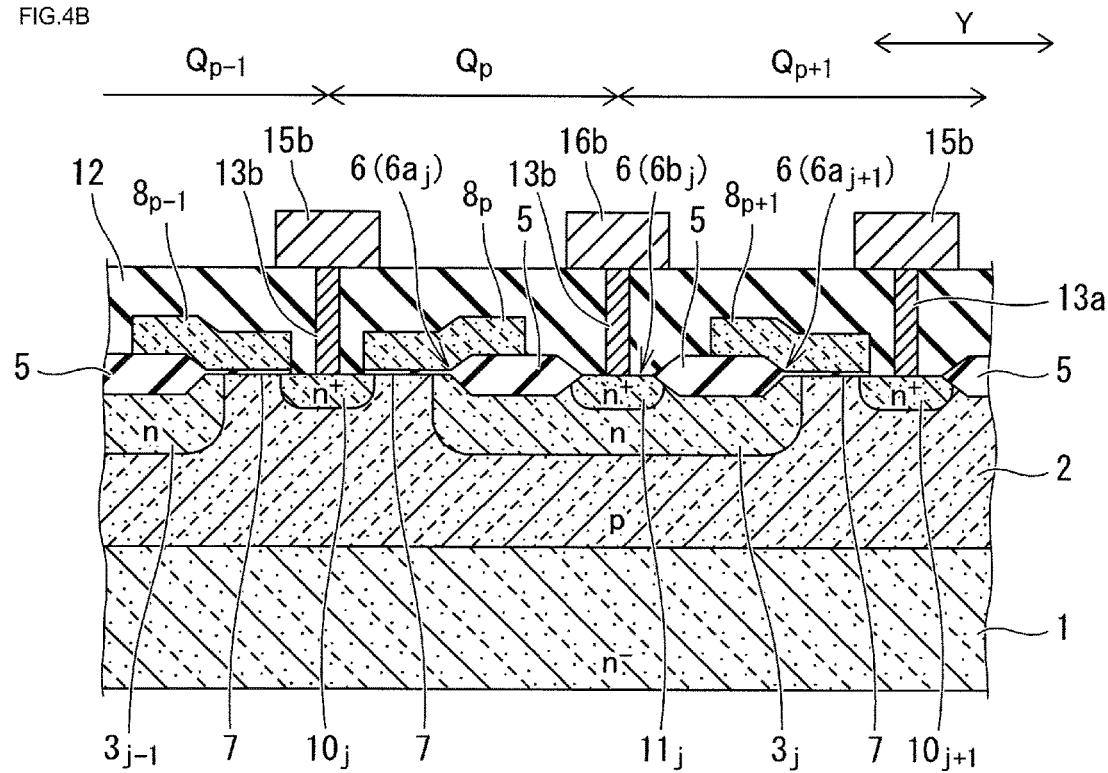
FIG. 4B is a schematic sectional view showing a sectional construction along the line IIB-IIB in FIG. 1 of a semiconductor device according to an embodiment of the present invention.

As shown in FIGS. 4A and 4B, an interlayer dielectric film 12 is formed of a silicon dioxide film, for example, over the principal surface of the semiconductor substrate 1 covering the gate electrodes 8. On the interlayer dielectric film 12, formed are a first metallic line 15 for first main electrode region electrically connected to the first main electrode regions $10_{j-1}$, $10_j$, and $10_{j+1}$ and a second metallic line 16 for second main electrode region electrically connected to the second main electrode regions $11_{j-1}$ and $11_j$. The first metallic line 15 and second metallic line 16 are formed in the same wiring line layer and made, for example, of an aluminum film or an aluminum alloy film of Al—Si, Al—Cu, or Al—Si—Cu.

As shown in FIG. 1, the first metallic line 15 is composed of a first portion 15a of the first metallic line 15 and a plurality of second portions 15b of the first metallic line 15. The first portion 15a of the first metallic line 15 extends in the Y direction at the position outside of one end side of the first main electrode regions $10_{j-1}$, $10_j$, and $10_{j+1}$ and the second main electrode regions $11_{j-1}$ and $11_j$ above the field insulation film 5 in the plan view of the principal surface of the semiconductor substrate 1. The second portions 15b of the first metallic line 15 extend in the X direction over the first main electrode regions $10_{j-1}$, $10_j$, and $10_{j+1}$ from the first portion 15a of the first metallic line 15. Each of the second portions 15b of the first metallic line 15 is connected electrically to the corresponding first main electrode regions $10_{j-1}$, $10_j$, and $10_{j+1}$ through conductive plugs 13a embedded in the interlayer dielectric film 12.

The second metallic line 16 is composed of a first portion 16a of the second metallic line 16 and a plurality of second portions 16b of the second metallic line 16. The first portion 16a of the second metallic line 16 extends in the Y direction at the position outside of the other end side of the first main electrode regions $10_{j-1}$, $10_j$, and $10_{j+1}$ and the second main electrode regions $11_{j-1}$ and $11_j$ above the field insulation film 5 in the plan view of the principal surface of the semiconductor substrate 1. The second portions 16b of the second metallic line 16 extend in the X direction over the second main electrode regions $11_{j-1}$ and $11_j$ from the first portion 16a of the second metallic line 16. Each of the second portions 16b of the second metallic line 16 is connected electrically to the corresponding second main electrode regions $11_{j-1}$ and $11_j$ through conductive plugs 13b embedded in the interlayer dielectric film 12.

As shown in FIGS. 3, 4A, and 4B, drift regions $3_{j-1}$ and $3_j$ are provided in the configuration of islands surrounded by the channel-forming region 2 in the principal surface region of the semiconductor substrate 1. The second main electrode regions $11_{j-1}$ and $11_j$ are formed in the drift regions $3_{j-1}$ and $3_j$. In the drift region $3_{j-1}$ and $3_j$ further provided are first stopper regions $4a_{j-1}$ and $4a_j$ with a higher impurity concentration than the drift regions $3_{j-1}$ and $3_j$ selectively under the first gate interconnection 9a at the end region of the drift regions $3_{j-1}$ and $3_j$ separated from the second main electrode regions $11_{j-1}$ and $11_j$.

The semiconductor device according to the embodiment of the present invention is provided, as shown in FIGS. 2, 4A, and 4B, with second stopper regions $4b_{j-1}$ and $4b_j$ like the first stopper regions $4a_{j-1}$ and $4a_j$ under the second gate interconnection 9b, the first gate interconnection 9a and second gate interconnection 9b being disposed at both the end regions of the gate electrodes $8_{p-2}$, $8_{p-1}$, $8_p$, and $8_{p+1}$.

Figure 6:
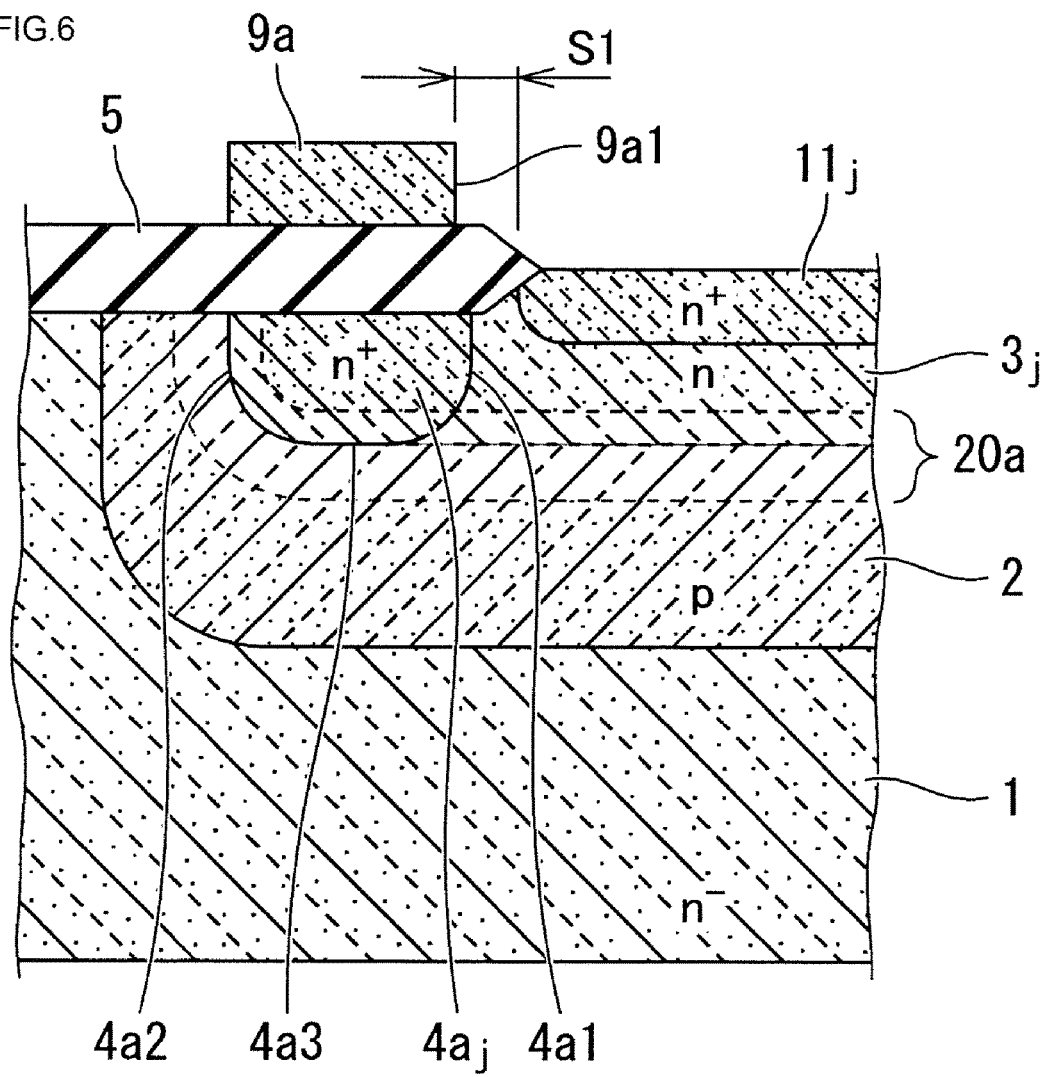
FIG. 6 is a sectional view showing extension of a depletion layer developing at the boundary of a pn junction between a channel forming region and an offset region, which is a drift region, in a semiconductor device according to an embodiment of the present invention.

The first stopper regions $4a_{j-1}$ and $4a_j$, and the second stopper regions $4b_{j-1}$ and $4b_j$, which have a higher impurity concentration than the drift regions $3_{j-1}$ and $3_j$, are disposed opposing with each other at the both ends of the drift regions $3_{j-1}$ and $3_j$. Even though a field plate effect occurs upon application of a voltage on the first gate interconnection 9a and the second gate interconnection 9b as described in detail afterwards, the first stopper regions $4a_{j-1}$ and $4a_j$, and the second stopper regions $4b_{j-1}$ and $4b_j$ obstruct expansion of the depletion layer 20a, which is indicated in FIG. 6, toward the second main electrode regions $11_{j-1}$ and $11_j$ under the first gate interconnection 9a and second gate interconnection second gate interconnection 9b, the depletion layer 20a developing at the pn junction between the channel-forming region 2 and the drift regions $3_{j-1}$ and $3_j$.

In other words, the first gate interconnection 9a is disposed at one end part of the drift regions $3_{j-1}$ and $3_j$ under the field insulation film 5 at the outside of one end of the second main electrode regions $11_{j-1}$ and $11_j$. The second gate interconnection 9b is disposed at the other end part of the drift region $3_{j-1}$ and $3_j$ under the field insulation film 5 at the outside of the other end of the second main electrode regions $11_{j-1}$ and $11_j$.

In yet other words, the first gate interconnection 9a is disposed on the field insulation film 5 right above the first stopper regions $4a_{j-1}$ and $4a_j$ at the outside of one end of the second main electrode regions $11_{j-1}$ and $11_j$. The second gate interconnection 9b is disposed on the field insulation film 5 right above the second stopper regions $4b_{j-1}$ and $4b_j$ at the outside of the other end of the second main electrode regions $11_{j-1}$ and $11_j$.

As shown in FIGS. 2 and 4A, the first stopper region $4a_j$ is so arranged that the end $4a1$ of the first stopper region $4a_j$ at the side of second main electrode region $11_j$ is nearer to the second main electrode region $11_j$ than the end $9a1$ of the first gate interconnection 9a at the side of the second main electrode region $11_j$. Similarly to the first stopper region $4a_j$, the second stopper region $4b_j$ is so arranged that the end $4b1$ of the second stopper region $4b_j$ at the side of second main electrode region $11_j$ is nearer to the second main electrode region $11_j$ than the end $9b1$ of the second gate interconnection 9b at the side of the second main electrode region $11_j$.

Similarly to the first stopper region $4a_j$ as shown in FIG. 2, the first stopper region $4a_{j-1}$ is so arranged that the end $4a1$ of the first stopper region $4a_{j-1}$ at the side of second main electrode region $11_{j-1}$ is nearer to the second main electrode region $11_{j-1}$ than the end $9a1$ of the first gate interconnection 9a at the side of the second main electrode region $11_{j-1}$. Similarly to the second stopper region $4b_j$ as shown in FIG. 2, the second stopper region $4b_{j-1}$ is so arranged that the end 4b1 of the second stopper region $4b_{j-1}$ at the side of second main electrode region $11_{j-1}$ is nearer to the second main electrode region $11_{j-1}$ than the end 9b1 of the second gate interconnection 9b at the side of the second main electrode region $11_{j-1}$.

Each of the first stopper region $4a_j$ and the second stopper region $4b_j$ is formed, as shown in FIG. 4A, with an approximately equal depth, or thickness, and has the end 4a2 or 4b2 at the side away from the second main electrode region $11_j$ and the bottom 4a3 or 4b3 being in contact with the channel-forming region 2. As shown in FIG. 3, each of the first stopper region 4aj and the second stopper region 4bj is formed in a form of ellipse with the major axis thereof extending along the Y direction and the length of the major axis is longer than the width of the second main electrode region $11_j$ and approximately equal to the width of the drift region $3_j$.

Similarly to the first stopper region $4a_j$ and the second stopper region $4b_j$, each of the first stopper region $4a_{j-1}$ and the second stopper region $4b_{j-1}$ is formed, though not depicted, with an approximately equal depth, or thickness, and has the end at the side away from the second main electrode region $11_{j-1}$ and the bottom thereof being in contact with the channel-forming region 2. Similarly to the first stopper region 4aj and the second stopper region $4b_j$, each of the first stopper region $4a_{j-1}$ and the second stopper region $4b_{j-1}$ is formed, as shown in FIG. 2 and FIG. 3, in a form of ellipse with the major axis thereof extending along the Y direction and the length of the major axis is longer than the width of the second main electrode region $11_{j-1}$ and approximately equal to the width of the drift region $3_{j-1}$.

The following shows examples of impurity concentrations of the semiconductor regions in the semiconductor device according to the embodiment of the invention.

The channel-forming region 2 of a first conductivity type, which is a p type in this embodiment example, is formed with an impurity concentration of $1 \times 10^{16}/cm^3$ to $8 \times 10^{16}/cm^3$, for example. The first main electrode regions $10_{j-1}$, $10_j$, and $10_{j+1}$, which are source regions, of a second conductivity type, which is an n+ type in this embodiment example, and the second main electrode regions $11_{j-1}$ and $11_j$, which are drain regions, of the second conductivity type, which is an n+ type in this embodiment example, are formed with an impurity concentration of $1 \times 10^{20}/cm^3$ to $4 \times 10^{20}/cm^3$, for example. The drift regions $3_{j-1}$ and $3_j$ are formed with a lower impurity concentration than the second main electrode regions $11_{j-1}$ and $11_j$ and have an impurity concentration of $1 \times 10^{16}/cm^3$ to $8 \times 10^{16}/cm^3$, for example. Impurity concentrations of the drift regions $3_{j-1}$ and $3_j$ are determined to be such a value that avoids electric field concentration at the surface of the drift regions $3_{j-1}$ and $3_j$ under the gate insulation film 7, and set in consideration of ON resistance. The first stopper regions $4a_{j-1}$ and $4a_j$ and the second stopper regions $4b_{j-1}$ and $4b_j$ are formed with an impurity concentration lower than that of the second main electrode regions $11_{j-1}$ and $11_j$ and higher than that of the drift regions $3_{j-1}$ and $3_j$, and at a value from $2 \times 10^{16}/cm^3$ to $2 \times 10^{17}/cm^3$, for example.

In operation of the transistor cells $Q_{p-2}$, $Q_{p-1}$, $Q_p$, $Q_{p+1}$ having the construction described above, a first reference voltage, for example zero volts, is applied to the first main electrode regions $10_{j-1}$, $10_j$, and $10_{j+1}$, a second reference voltage, for example 20V, higher than the first reference voltage is applied to the second main electrode regions $11_{j-1}$ and $11_j$, and a control voltage, for example 5 V, is applied to the gate electrodes $8_{p-2}$, $8_{p-}$, $8_p$, and $8_{p+1}$. Upon application of these voltages, channels are formed in the channel-forming region 2 under the gate electrodes $8_{p-2}$, $8_{p-}$, $8_p$, and $8_{p+1}$. Carriers move through the channel and the drift regions $3_{j-1}$ and $3_j$ from the first main electrode regions $10_{j-1}$, $10_j$, and $10_{j+1}$ to the second main electrode regions $11_{j-1}$ and $11_j$. In the operation of the transistor cells $Q_{p-2}$, $Q_{p-1}$, $Q_p$, $Q_{p+1}$, the first gate interconnection 9a and second gate interconnection 9b receive a control voltage that tends to expand a depletion layer 20a as depicted in FIG. 6 generated at the pn junction between the channel-forming region 2 and the drift regions $3_{j-1}$ and $3_j$, and the electric potential is fixed.

Figure 5:
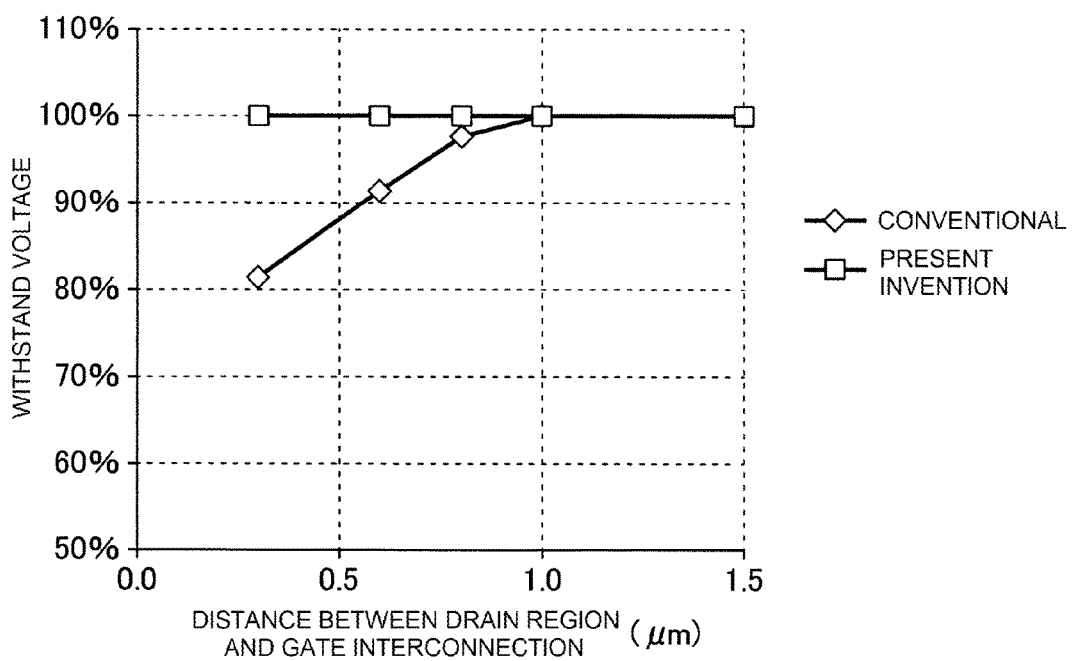
FIG. 5 is a diagram showing the results of withstand voltage simulation for a semiconductor device according to an embodiment of the present invention and a lateral MOSFET according to a conventional technology.

FIG. 5 is a diagram showing an example of simulation results of withstand voltage for a semiconductor device, which is a lateral MOSFET according to an embodiment of the present invention and for a conventional lateral MOSFET. The data for the semiconductor device of the embodiment of the invention is the one with the impurity concentration of the second stopper regions $4b_{j-1}$ and $4b_j$ being 1.5 times the impurity concentration of the first stopper regions first stopper region $4a_{j-1}$ and first stopper region $4a_j$ and the drift regions $3_{j-1}$ and $3_j$.

As shown in FIG. 5, the conventional lateral MOSFET exhibits that degradation in withstand voltage occurs between the channel-forming region 102 and the second main electrode region 111, which is a drain region, when the distance S2 indicated in FIG. 7 between the channel-forming region 102 and the second main electrode region 111 is shorter than 1 μm. In contrast, the semiconductor device according to the embodiment of the invention exhibits that no degradation in withstand voltage occurs between the channel-forming region 2 and the second main electrode region $11_j$, which is a drain region, even when the distance S1 indicated in FIG. 6 between the channel-forming region 2 and the second main electrode region $11_j$ is only 0.3 μm.

The following describes a method of manufacturing a semiconductor device, which is a lateral MOSFET, according to the embodiment of the present invention with reference to FIGS. 8A through 11B.

Figure 8A:
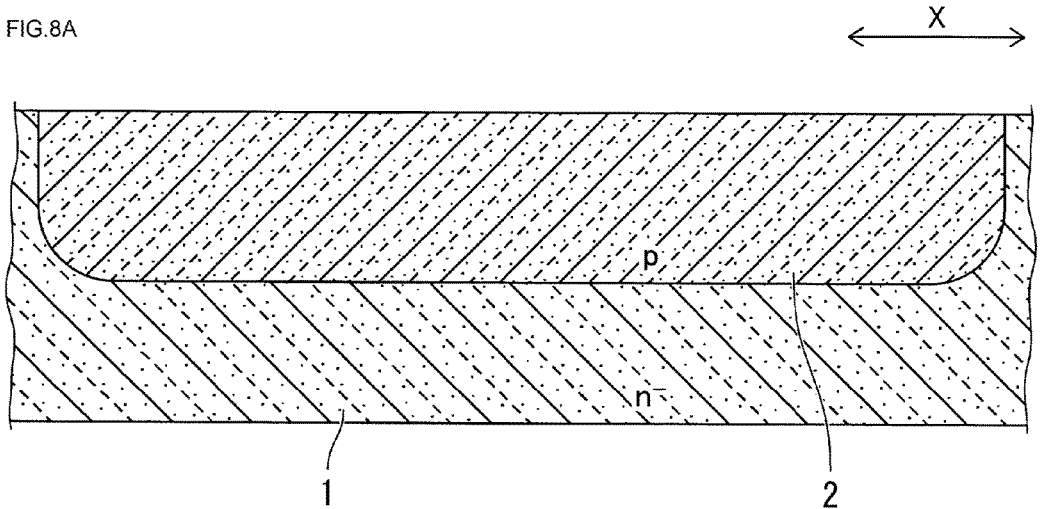
FIG. 8A is a sectional view at a place corresponding to the line IIA-IIA in FIG. 1 illustrating a step in a manufacturing process for a semiconductor device according to an embodiment of the present invention.
Figure 8B:
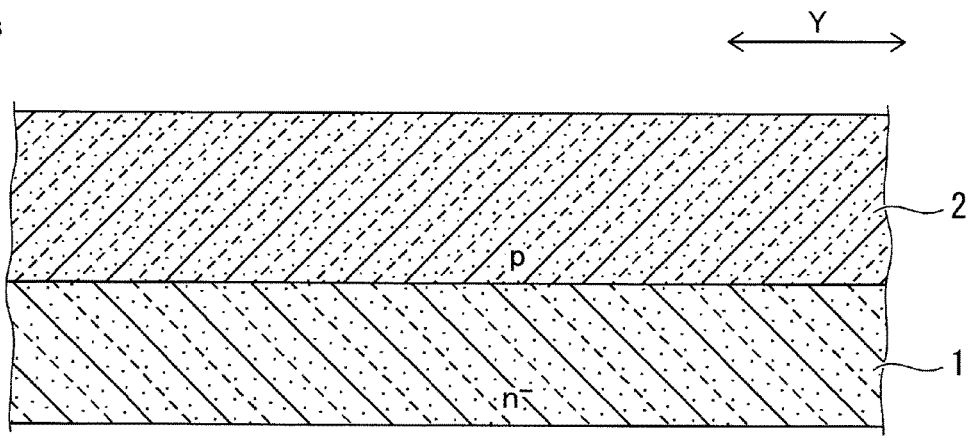
FIG. 8B is a sectional view at a place corresponding to the line IIB-IIB in FIG. 1 illustrating a step in a manufacturing process for a semiconductor device according to an embodiment of the present invention.

First, a semiconductor substrate 1 of a second conductivity type, which is an n⁻ type in this embodiment example, is prepared as shown in FIGS. 8A and 8B.

Then as shown in FIGS. 8A and 8B, a channel-forming region 2 of a first conductivity type, which is a p type, is formed on the principal surface side of the semiconductor substrate 1. The channel-forming region 2 is formed by selective ion implantation of impurity ions of boron ions, for example, on the principal surface side of the semiconductor substrate 1 followed by heat treatment for activating the implanted impurity ions.

Figure 9A:
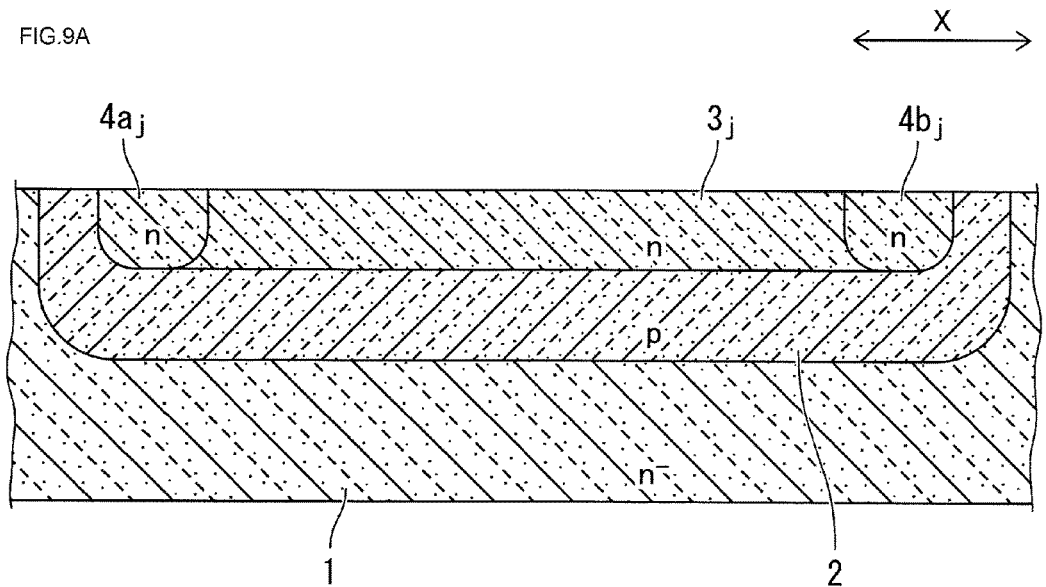
FIG. 9A is a sectional view at a place corresponding to the line IIA-IIA in FIG. 1 illustrating a step following the one in FIG. 8A in a manufacturing process for a semiconductor device according to an embodiment of the present invention.
Figure 9B:
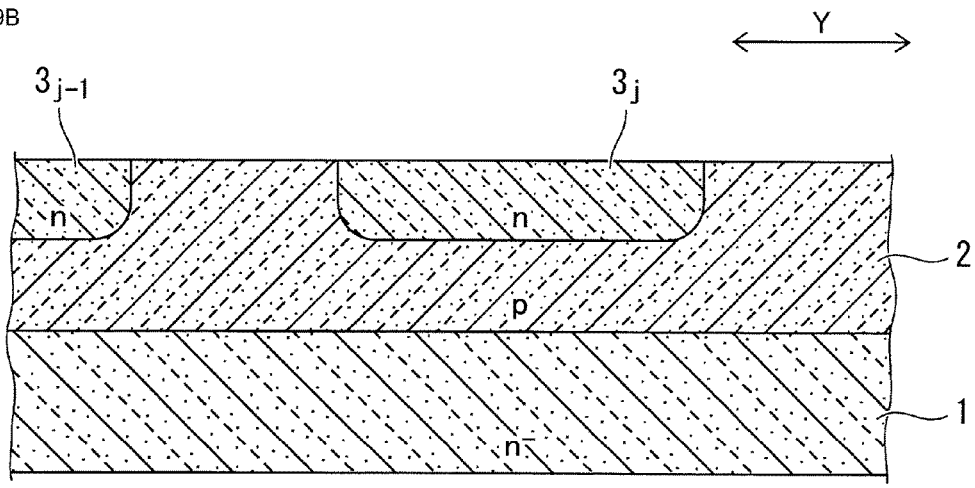
FIG. 9B is a sectional view at a place corresponding to the line IIB-IIB in FIG. 1 illustrating a step following the one in FIG. 8B in a manufacturing process for a semiconductor device according to an embodiment of the present invention.

Then as shown in FIGS. 9A and 9B, on the upper part of the channel-forming region 2 in the principal surface region of the semiconductor substrate 1, a drift region $3_j$ of the second conductivity type (n type) is formed and a first stopper region $4a_j$ and a second stopper region $4b_j$ of the second conductivity type (n type) are formed at both sides in the X direction of the drift region $3_j$. The drift region $3_j$ is formed by selective ion implantation of impurity ions of phosphorus ions, for example. The first and second stopper regions $4a_j$ and $4b_j$ are formed by selective ion implantation of impurity ions of arsenic, for example. The implanted impurity ions are then activated by heat treatment. In this process, a drift region $3_{j-1}$ of the second conductivity type (n type) is formed in the upper part of the channel-forming region 2. At the same time in this process a first stopper region $4a_{j-1}$ and a second stopper region $4b_{j-1}$ are also formed at the both sides in the X direction of the drift region $3_{j-1}$.

Figure 10A:
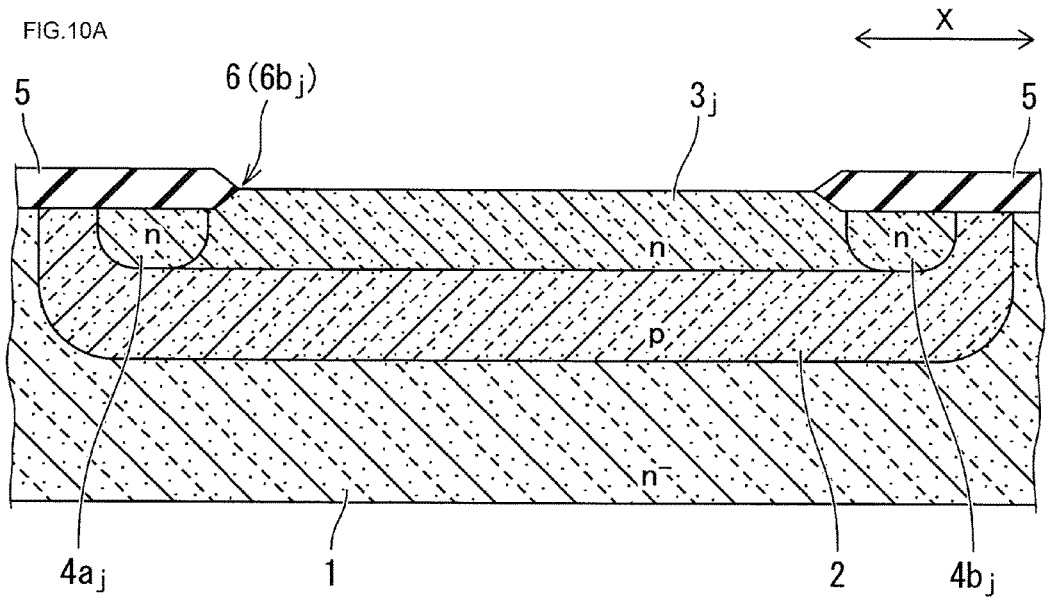
FIG. 10A is a sectional view at a place corresponding to the line IIA-IIA in FIG. 1 illustrating a step following the one in FIG. 9A in a manufacturing process for a semiconductor device according to an embodiment of the present invention.
Figure 10B:
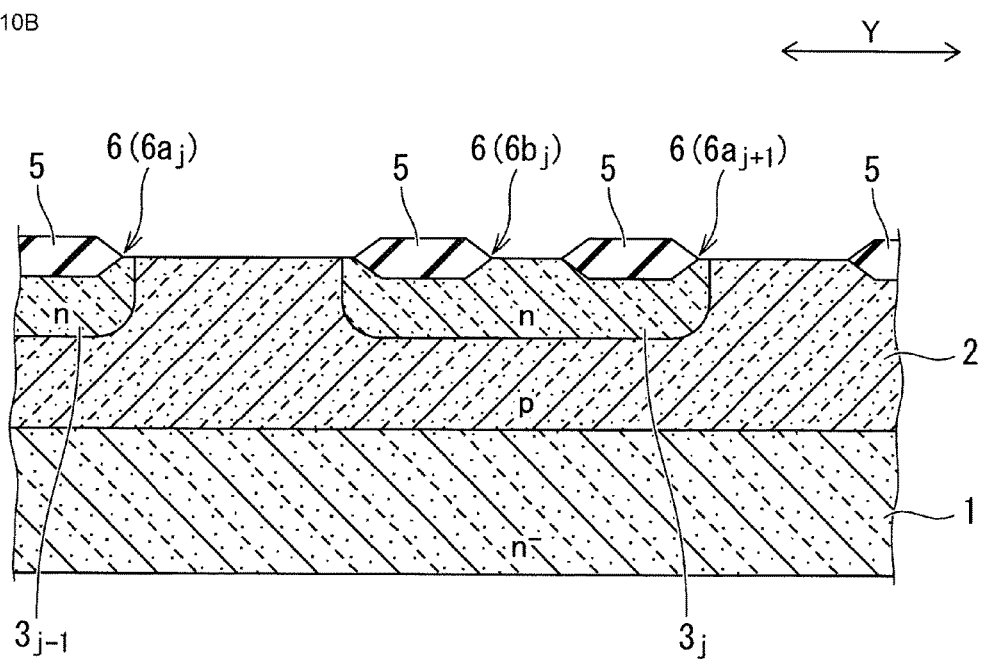
FIG. 10B is a sectional view at a place corresponding to the line IIB-IIB in FIG. 1 illustrating a step following the one in FIG. 9B in a manufacturing process for a semiconductor device according to an embodiment of the present invention.

Then as shown in FIGS. 10A and 10B, a field insulation film 5 is formed of a silicon oxide film by means of selective oxidation on a principal surface of the semiconductor substrate 1. The field insulation film 5 is formed on the principal surface of the semiconductor substrate 1 at non-active regions where transistor cells $Q_{p-2}$, $Q_{p-1}$, $Q_p$, $Q_{p+1}$ are not formed. The field insulation film 5 is also selectively formed in active regions where transistor cells $Q_{p-2}$, $Q_{p-1}$, $Q_p$, $Q_{p+1}$ are formed, excepting the regions for forming a gate insulation film 7, first main electrode regions $10_{j-1}$, $10_j$, and $10_{j+1}$, and second main electrode regions $11_{j-1}$ and $11_j$. The field insulation film 5 is formed in a shape of ladder having a plurality of windows 6 including windows $6a_{j-1}$, $6b_{j-1}$, $6a_j$, $6b_j$, and $6a_{j+1}$.

Figure 11A:
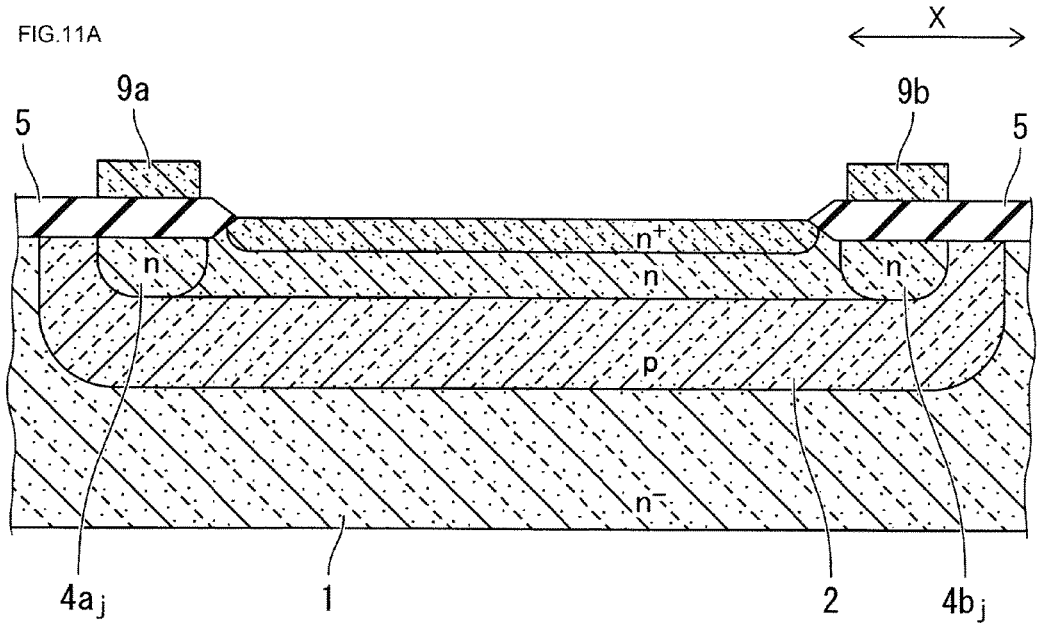
FIG. 11A is a sectional view at a place corresponding to the line IIA-IIA in FIG. 1 illustrating a step following the one in FIG. 10A in a manufacturing process for a semiconductor device according to an embodiment of the present invention.
Figure 11B:
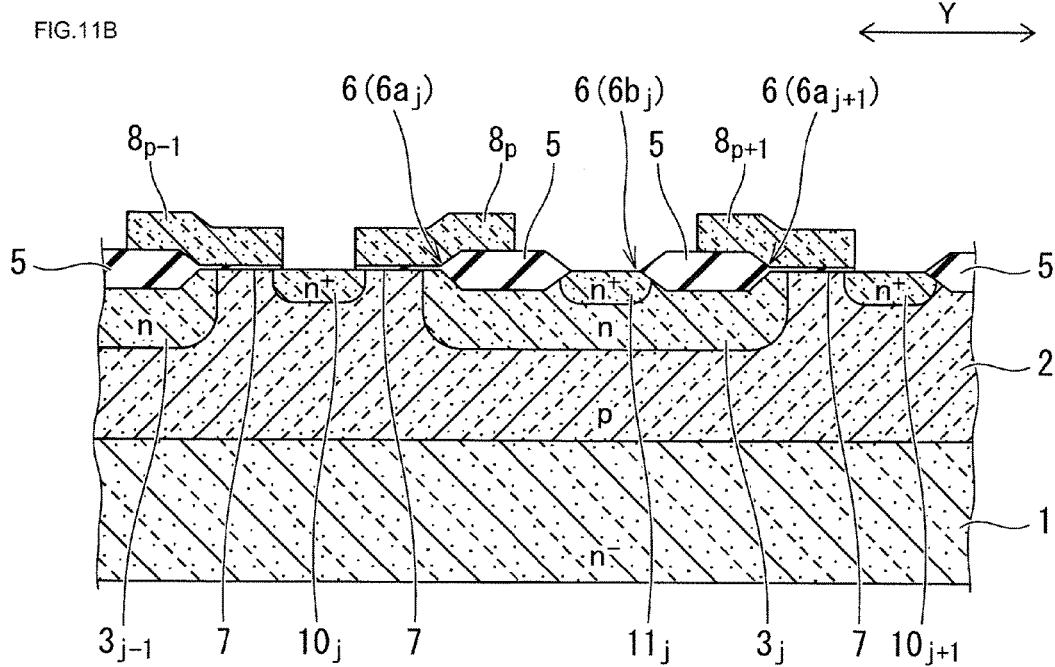
FIG. 11B is a sectional view at a place corresponding to the line IIB-IIB in FIG. 1 illustrating a step following the one in FIG. 10B in a manufacturing process for a semiconductor device according to an embodiment of the present invention.

Then as shown in FIGS. 11A and 11B, gate insulation films 7 are formed in the windows 6 including windows $6a_{j-1}$, $6b_{j-1}$, $6a_j$, $6b_j$, and $6a_{j+1}$ composed of silicon dioxide films by means of thermal oxidation.

Then, a conductive layer of doped silicon layer with a low resistivity containing impurities is formed on the whole surface of the principal surface of the semiconductor substrate 1 including on the field insulation film 5 and the gate insulation film 7. After that, the doped polysilicon layer is patterned as shown in FIGS. 11A and 11B to form a plurality of gate electrodes $8_{p-2}$, $8_{p-1}$, $8_p$, and $8_{p+1}$ and first gate interconnection 9a and second gate interconnection 9b connected together with the both ends of the plurality of gate electrodes $8_{p-2}$, $8_{p-1}$, $8_p$, and $8_{p+1}$. The plurality of gate electrodes $8_{p-2}$, $8_{p-1}$, $8_p$, and $8_{p+1}$ are formed individually corresponding to respective transistor cells $Q_{p-2}$, $Q_{p-1}$, $Q_p$, and $Q_{p+1}$. The plurality of gate electrodes $8_{p-2}$, $8_{p-1}$, $8_p$, and $8_{p+1}$ are formed mainly on the gate insulation film 7 and in a configuration with the sides of the gate electrodes next to the second main electrode regions $11_{j-1}$ and $11_j$ riding over the field insulation film 5. The first gate interconnection 9a extends in the Y direction on the field insulation film 5 at the outside of one sides of the first main electrode regions $10_{j-1}$, $10_j$, and $10_{j+1}$, and second main electrode regions $11_{j-1}$ and $11j$, and connected together with the one sides of the plurality of gate electrodes $8_{p-2}$, $8_{p-1}$, $8_p$, and $8_{p+1}$. The second gate interconnection 9b extends in the Y direction on the field insulation film 5 at the outside of the other sides of the first main electrode regions $10_{j-1}$, $10_j$, and $10_{j+1}$, and second main electrode regions $11_{j-1}$ and $11j$, and connected together with the other sides of the plurality of gate electrodes $8_{p-2}$, $8_{p-1}$, $8_p$, and $8_{p+1}$. In this process, the gate insulation film 7 in the windows $6b_{j-1}$ and $6b_j$ for second main electrode regions are removed by over-etching.

Then as shown in FIGS. 11A and 11B, the first main electrode regions $10_{j-1}$, $10_j$, and $10_{j+1}$, are formed in the upper part of the channel-forming region 2 in the upper part of the principal surface side of the semiconductor substrate 1. At the same time, second main electrode regions $11_{j-1}$ and $11_j$ are formed in the upper part of the drift regions $3_{j-1}$ and $3_j$. The first main electrode regions $10_{j-1}$, $10_j$, and $10_{j+1}$ and the second main electrode regions $11_{j-1}$ and $11_j$ are formed by selective ion implantation of impurity ions of arsenic ions, for example, into the upper part of the channel-forming region 2 and the drift region $3_{j-1}$ and $3_j$ using the field insulation film 5 and the gate electrodes $8_{p-2}$, $8_{p-1}$, $8_p$, and $8_{p+1}$ as masks for the ion implantation. After that, the impurity ions are activated by heat treatment. The first main electrode regions $10_{j-1}$, $10_j$, and $10_{j+1}$ and the second main electrode regions $11_{j-1}$ and $11_j$ are formed individually corresponding to each of the plurality of transistor cells $Q_{p-2}$, $Q_{p-1}$, $Q_p$, $Q_{p+1}$.

Then, on the whole surface of the principal surface of the semiconductor substrate 1 including on the gate electrodes 8 and on the first gate interconnection 9a and second gate interconnection 9b, an interlayer dielectric film 12 is formed of a silicon oxide film by means of a CVD method, for example. After that, conductive plugs 13a to be electrically connected to the first main electrode regions $10_{j-1}$, $10_j$, and $10_{j+1}$ are formed through the interlayer dielectric film 12 corresponding to the respective first main electrode regions $10_{j-1}$, $10_j$, and $10_{j+1}$, and at the same time, conductive plugs 13b to be electrically connected to the second main electrode regions $11_{j-1}$ and $11_j$ are formed through the interlayer dielectric film 12 corresponding to the respective second main electrode regions $11_{j-1}$ and $11_j$. On the whole surface of the interlayer dielectric film 12 including on the conductive plugs 13a and 13b, a metal layer is formed of an aluminum film or an aluminum alloy film, for example, by means of sputtering deposition. After that, the metal layer is patterned to form the first metallic line 15 and second metallic line 16 as shown in FIG. 1 and FIGS. 4A and 4B.

After that, a passivation film of a polyimide resin, for example, is formed on the interlayer dielectric film 12, covering the first metallic line 15 and second metallic line 16. On the back surface of the semiconductor substrate 1, back surface electrodes are formed. Thus, the wafer process for manufacture the semiconductor device as shown in FIGS. 1 through 4B according to the embodiment of the present invention is completed.

Figure 7A:
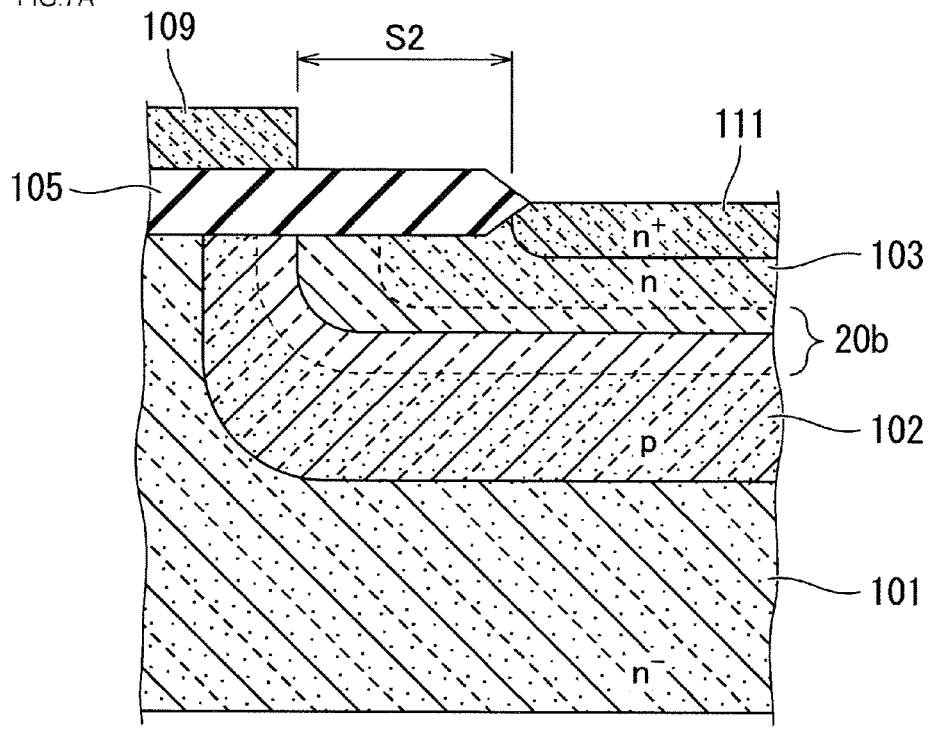
FIG. 7A is a sectional view showing extension of a depletion layer developing at the boundary of a pn junction between a channel forming region and an offset region in a case of the gate interconnection remote from the second main electrode region.
Figure 7B:
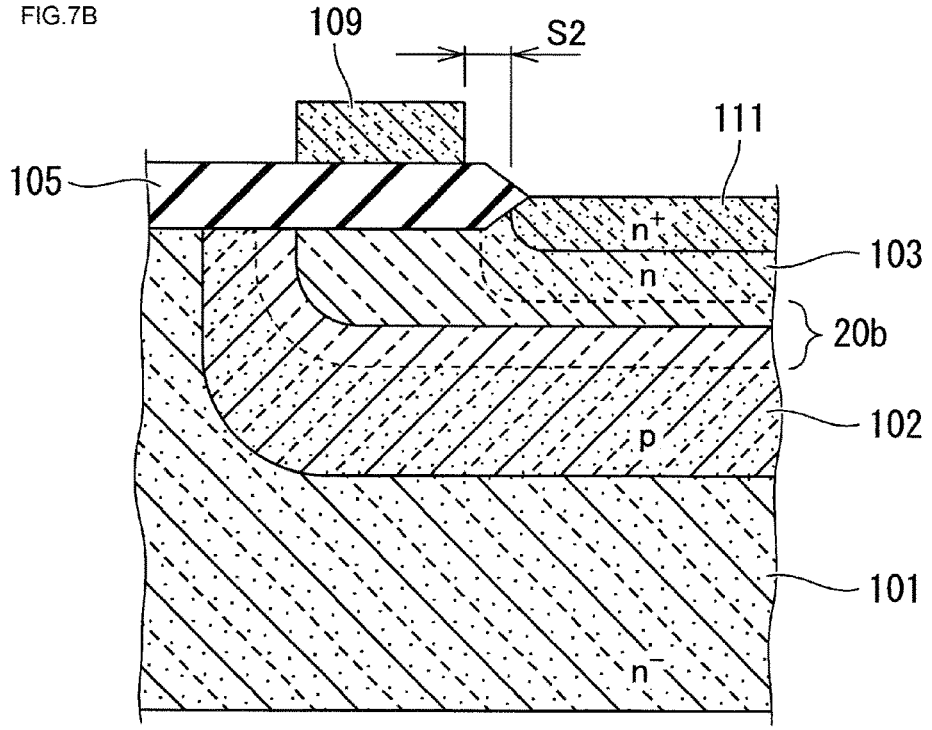
FIG. 7B is a sectional view showing extension of a depletion layer developing at the boundary of a pn junction between a channel forming region and an offset region in a case of the gate interconnection near to the second main electrode region.

Here, comparison is made between the semiconductor device, which is a lateral MOSFET, according to the embodiment of the present invention and a conventional lateral MOSFET. FIG. 6 is a sectional view of an essential part of the semiconductor device according to the embodiment of the invention showing extension of the depletion layer developed at the pn junction between a channel-forming region and a drift region. FIGS. 7A and 7B are sectional views of an essential part of a conventional lateral MOSFET showing extension of the depletion layer developed at the pn junction between a channel-forming region and a drift region, wherein FIG. 7A is a sectional view in the case of the gate interconnection apart from the second main electrode region, and FIG. 7B is a sectional view in the case of the gate interconnection close to the second main electrode region.

In the conventional lateral MOSFET as shown in FIG. 7A, a depletion layer 20b develops at the pn junction between a channel-forming region 102 of a first conductivity type (p type) formed on the principal surface side of the semiconductor substrate 101 of a second conductivity type (n⁻ type) and a drift region 103 of the second conductivity type (n type) formed in the upper part of the channel-forming region 102. If the impurity concentration of the drift layer 103 is too high, the depletion layer 20b does not extend toward the side of second main electrode region 111, which is a drain region, of a second conductivity (n type) formed in the upper part of the drift region 103, resulting in insufficient electric field relaxation effect. On the other hand, if the impurity concentration of the drift layer 103 is too low, the depletion layer 20b extends too far toward the side of second main electrode region 111 and electric field concentration occurs at the second main electrode region 111, resulting in degradation of withstand voltage between the channel-forming region 102 and the second main electrode region 111. Accordingly, the width of the drift region 103 between the channel-forming region 102 and the second main electrode region 111 is designed to relax the high electric field.

In order to downsize a lateral MOSFET, it is effective to dispose the gate interconnection 109 extending on the field insulation film 105 close to the second main electrode region 111. However, if the gate interconnection 109 extending on the field insulation film 105 is positioned close to the second main electrode region 111, or if the distance S2 between the gate interconnection 109 and the second main electrode region 111 is decreased as shown in FIG. 7B, the depletion layer 20b that develops at the pn junction between the channel-forming region 102 and the drift region 103 expands toward the second main electrode region 111, which is a drain region, under the gate interconnection 109 due to a field plate effect of the gate interconnection 109 subjected to an operating voltage. This causes electric field concentration at the edge of the second main electrode region 111 in the side of the first gate interconnection 109, resulting in degradation of the withstand voltage, which is a device withstand voltage, between the channel-forming region 102 and the second main electrode region 111.

In the semiconductor device according to the embodiment of the present invention as described earlier, first stopper regions $4a_{j-1}$ and $4a_j$ with a higher impurity concentration than the drift regions $3_{j-1}$ and $3_j$ are provided in the drift regions $3_{j-1}$ and $3_j$ under the first gate interconnection 9a away from the second main electrode regions $11_{j-1}$ and $11_j$. In this construction as shown in FIG. 6, when the distance S1 between the first gate interconnection 9a extending along the Y direction on the field insulation film 5 and the second main electrode region $11_j$ is made short, and even though a field plate effect is produced by the first gate interconnection 9a subjected with an operating voltage, the extension of the depletion layer 20a developed at the pn junction between the channel-forming region 2 and the drift region $3_j$ toward the second main electrode region $11_j$, which is a drain region, is obstructed under the first gate interconnection 9a. Thus, electric field concentration is avoided at the second main electrode region $11_j$. Though not depicted in FIG. 6, in the drift region $3_{j-1}$ as well as in the drift region $3_j$, the extension of the depletion layer 20a developed at the pn junction between the channel-forming region 2 and the drift region $3_{j-1}$ toward the second main electrode region $11_{j-1}$, which is a drain region, is obstructed under the first gate interconnection 9a. Thus, electric field concentration is avoided at the second main electrode region $11_{j-1}$. Therefore, the semiconductor device according to the embodiment of the invention ensures a withstand voltage, or a device withstand voltage, between the channel-forming region 2 and the second main electrode regions $11_{j-1}$ and $11_j$ at one end side of the second main electrode regions $11_{j-1}$ and $11_j$, and at the same time, minimizes the size thereof.

As shown in FIGS. 1 through 4B, though not depicted in FIG. 6, in the drift regions $3_{j-1}$ and $3_j$, under the second gate interconnection 9b, second stopper regions $4b_{j-1}$ and $4b_j$ with higher impurity concentration than the drift regions $3_{j-1}$ and $3_j$ are provided apart from the second main electrode regions $11_{j-1}$ and $11_j$. In this construction, when the distance between the first gate interconnection 9b extending along the Y direction on the field insulation film 5 and the second main electrode regions $11_{j-1}$ and $11_j$ is made short, and even though a field plate effect is produced by the second gate interconnection 9b subjected to an operating voltage, the extension of the depletion layer 20a developed at the pn junction between the channel-forming region 2 and the drift regions $3_{j-1}$ and $3_j$ toward the second main electrode regions $11_{j-1}$ and $11_j$ is obstructed under the second gate interconnection 9b. Thus, electric field concentration is avoided at the second main electrode regions $11_{j-1}$ and $11_j$. Therefore, the semiconductor device according to the embodiment of the invention ensures a withstand voltage, or a device withstand voltage, between the channel-forming region 2 and the second main electrode regions $11_{j-1}$ and $11_j$ at the other end side of the second main electrode regions $11_{j-1}$ and $11_j$, and at the same time, minimizes the size thereof.

Preferably, the ends 4a1 and 4b1 of the first stopper region $4a_{j-1}$ and $4a_j$ and the second stopper region $4b_{j-1}$ and $4b_j$ at the side of the second main electrode regions $11_{j-1}$ and $11_j$ are positioned nearer to the side of second main electrode regions $11_{j-1}$ and $11_j$ than the ends 9a1 and 9b1 of the first gate interconnection 9a and second gate interconnection 9b at the side of the second main electrode regions $11_{j-1}$ and $11_j$. This is because, if the ends 9a1 and 9b1 of the first gate interconnection 9a and second gate interconnection 9b are positioned nearer to the second main electrode regions $11_{j-1}$ and $11_j$ than the ends 4a1 and 4b1 of the first stopper region $4a_{j-1}$ and $4a_j$ and the second stopper region $4b_{j-1}$ and $4b_j$, the depletion layer 20a developed at the pn junction between the channel-forming region 2 and the drift regions $3_{j-1}$ and $3_j$ tends to extends toward the second main electrode regions $11_{j-1}$ and $11_j$.

The extension of the depletion layer 20a toward the second main electrode regions $11_{j-1}$ and $11_j$ under the first gate interconnection 9a and second gate interconnection 9b can be obstructed by setting the impurity concentration of the first stopper region $4a_{j-1}$ and $4a_j$ and the second stopper region $4b_{j-1}$ and $4b_j$ to be higher than the impurity concentration of the drift regions $3_{j-1}$ and $3_j$ and to be lower than the impurity concentration of the second main electrode regions $11_{j-1}$ and $11_j$. However, if the impurity concentration of the first stopper region $4a_{j-1}$ and $4a_j$ and the second stopper region $4b_{j-1}$ and $4b_j$ is too low, the effect of obstructing extension of the depletion layer 20a toward the side of second main electrode regions $11_{j-1}$ and $11_j$ is reduced; and if the impurity concentration is too high, the high electric field relaxation effect is reduced. Accordingly, the impurity concentration of the first stopper region $4a_{j-1}$ and $4a_j$ and the second stopper region $4b_{j-1}$ and $4b_j$ is preferably in the range of 1.5 to 2 times the impurity concentration of the drift regions $3_{j-1}$ and $3_j$.

<Variations>

In the semiconductor device according to the embodiment of the invention as described above, the first stopper region $4a_{j-1}$ and $4a_j$ and the second stopper region $4b_{j-1}$ and $4b_j$ are formed in the shape of stripes extending continuously along the Y direction. However, the invention is not limited to such a shape, but as shown in FIG. 12, each of the first stopper regions $4a_{j-1}$ and $4a_j$ and the second stopper regions $4b_{j-1}$ and $4b_j$ can be arranged scattering at plural places along the Y direction.

Figure 13:
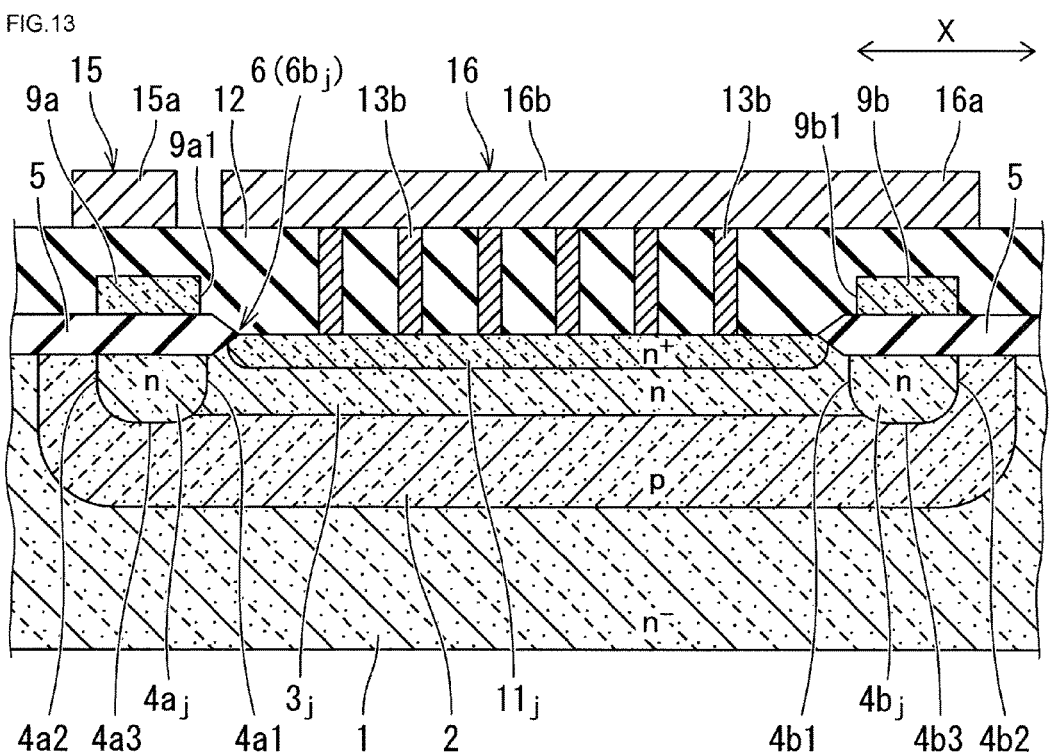
FIG. 13 is a sectional view at a place corresponding to the line IIA-IIA in FIG. 1 showing a second variation of a semiconductor device according to an embodiment of the present invention.

In the semiconductor device according to the embodiment of the invention as described above, the first stopper regions $4a_{j-1}$ and $4a_j$ and the second stopper regions $4b_{j-1}$ and $4b_j$ are formed with a depth approximately equal to the depth of the drift regions $3_{j-1}$ and $3_j$. However, the present invention is not limited to this depth, but the first stopper region $4a_{j-1}$ and $4a_j$ and the second stopper region $4b_{j-1}$ and $4b_j$ can be, as shown in FIG. 13, formed deeper, or thicker, so that the bottoms 4a3 and 4b3 thereof are positioned deeper than the bottom of the drift regions $3_{j-1}$ and $3_j$ protruding into the channel-forming region 2.

As described thus far, a semiconductor device according to the embodiment of the invention ensures a sufficient withstand voltage, which is a device withstand voltage, between the channel-forming region 2 and the second main electrode region 11, which is a drain region, simultaneously minimizing the size of the device.

In the semiconductor device according to the embodiment of the invention, the first main electrode region, which is a source region, and second main electrode region, which is a drain region, are arranged alternately along the shorter direction of the gate electrode, which is a direction of gate length or the Y direction. However, the present invention is not limited to the arrangement, but can also be applied to a semiconductor device having a construction composed of pairs of a first main electrode region and a second main electrode region. The present invention can more be applied to the case wherein a field plate effect arises at an edge in the longitudinal direction of a high concentration main electrode region in a certain electric potential condition even in an interconnection other than the gate interconnection that connects the gate electrodes. The present invention can further be applied to the case wherein degradation of withstand voltage due to a field plate effect arising from some electric potential condition of interconnection is to be avoided in the combination of a high concentration main electrode region and a low concentration drift region, or an offset region, for electric field relaxation, even in a semiconductor device other than a lateral MOSFET.

Although the semiconductor device according to an embodiment of the present invention described thus far is a lateral MOSFET, the present invention can also be applied to a lateral IGBT, for example.

Although the semiconductor device according to an embodiment of the present invention described thus far uses a silicon semiconductor substrate, the present invention can also be applied to a semiconductor device that uses a semiconductor substrate of silicon carbide (SiC) or gallium nitride (GaN), for example.

Reference numerals and signs are as follows:
1: semiconductor substrate
2: channel-forming region
3$j$: drift region
4$a_j$: first stopper region
4$b$: second stopper region
5: field insulation film
6: window
6$a_j$: window for first main electrode region
6$b_j$: window for second main electrode region
7: gate insulation film
8$_p$: gate electrode:
9$a$: first gate interconnection
9$b$: second gate interconnection
10$j$: first main electrode region, or a source region
11$j$: second main electrode region, or a drain region
12: interlayer dielectric film
13$a$, 13$b$: conductive plug
15: first metallic line
15$a$: first portion of the first metallic line
15$b$: second portion of the first metallic line
16: second metallic line
16$a$: first portion of the second metallic line
16$b$: second portion of the second metallic line Although a few embodiments have been shown and described, it would be appreciated by those skilled in the art that changes may be made in these embodiments without departing from the principles and spirit of the invention, the scope of which is defined in the claims and their equivalents.

What is claimed is:

1. A semiconductor device comprising:
a channel-forming region of a first conductivity type;
a first main electrode region of a second conductivity type disposed in a part of an upper part of the channel-forming region;
a drift region of the second conductivity type disposed in an upper part of the channel-forming region apart from the first main electrode region and being a region through which carriers from the first main electrode region run, the drift region and the channel-forming region forming a pn junction therebetween, the drift region having, in a plan view of the semiconductor device, a first side facing the first main electrode region and a second side substantially perpendicular to the first side;
a second main electrode region of the second conductivity type disposed in a part of an upper part of the drift region and receiving the carriers having run through the drift region from the first main electrode region;
a stopper region of the second conductivity type with higher impurity concentration than that of the drift region, disposed on the second side of the drift region, disposed apart from the first main electrode region, disposed without being positioned between the first main electrode region and the drift region, and obstructing extension of a depletion layer at the pn junction between the channel-forming region and the drift region;
a field insulation film having a window for the second main electrode region with a stripe shape;
a gate insulation film formed on a surface of the channel-forming region between the drift region and the first main electrode region; and
a gate electrode formed on the gate insulation film, wherein
the second main electrode region is disposed at a center of the drift region in the window for the second main electrode region,
the drift region extends from the window for the second main electrode region to a place under the field insulation film along a peripheral region of the window for the second main electrode region,
the field insulation film further comprises a pair of windows respectively for the first main electrode region and another first main electrode region, each of the pair of windows having a stripe shape and being disposed apart from the window for the second main electrode region,
the pair of windows are interposing the window for the second main electrode region in a direction perpendicular to a longitudinal direction of the window for the second main electrode region with the stripe shape,
the first main electrode region is disposed in an upper part of the channel-forming region apart from the drift region, at a center of the window for the first main electrode region in the direction perpendicular to the longitudinal direction, and
a surface interconnection, to which is applied a voltage of a same potential as that of a voltage applied to the gate electrode, is further provided on the field insulation film and is disposed above and over the stopper region.

2. The semiconductor device according to claim 1, wherein
the second side of the drift region is under the field insulation film, and
the stopper region has an elongated shape and is elongated along the second side of the drift region.

3. The semiconductor device according to claim 2, wherein the voltage applied to the surface interconnection is applied to extend the depletion layer.

4. The semiconductor device according to claim 1, wherein the gate electrode and the surface interconnection are formed as a same wiring layer.

5. The semiconductor device according to claim 1, wherein the second main electrode region of the second conductivity type is on top of a portion of the drift region.

6. A semiconductor device comprising:
a channel-forming region of a first conductivity type;
a field insulation film and a gate insulation film formed on a surface of the channel-forming region;
a plurality of gate electrodes extending along a first direction on the channel-forming region intercalating the gate insulation film and periodically arranged in a second direction that is perpendicular to the first direction;
a first gate interconnection extending on the field insulation film along the second direction and connecting one end sides of the plurality of gate electrodes together;
a drift region of a second conductivity type formed under a pair of the gate electrodes and under a region between the pair of gate electrodes on the channel-forming region, the drift region having, in a plan view of the semiconductor device, a first side facing the first main electrode region and a second side substantially perpendicular to the first side;
a pair of first main electrode regions of the second conductivity type formed on the channel-forming region and arranged interposing the pair of gate electrodes in the second direction;
a second main electrode region of the second conductivity type formed in the surface region of the drift region having a higher impurity concentration than the drift region; and
a first stopper region of the second conductivity type formed in the drift region, disposed on the second side of the drift region, disposed apart from the second main electrode region, disposed without being positioned between the first main electrode region and the drift region, being under the first gate interconnection, and having a higher impurity concentration than that of the drift region,
wherein the first main electrode region and the second main electrode region are arranged alternately and periodically in the second direction.

7. The semiconductor device according to claim 6, wherein an end of the first stopper region at the side of the second main electrode region is positioned nearer to the side of the second main electrode region than an end of the first gate interconnection at the side of the second main electrode region.

8. The semiconductor device according to claim 6, wherein a plurality of the first stopper regions are arranged to be interspersed on the second side of the drift region along the second direction.

9. The semiconductor device according to claim 6, wherein a bottom of the first stopper region is deeper than a bottom of the drift region.

10. The semiconductor device according to claim 6, wherein
the field insulation film is formed between the first main electrode region and the second main electrode region, and
a part of the gate electrode in the side of the second main electrode region is riding on the field insulation film.

11. The semiconductor device according to claim 6, wherein the field insulation film is formed in a ladder shape having a plurality of windows extending along the first direction and arranged periodically in the second direction.

12. The semiconductor device according to claim 11, comprising plural members of the gate insulation film, the plural gate insulation films arranged in every other window of the plurality of windows in the second direction.

13. The semiconductor device according to claim 12, comprising plural members of the second main electrode region, the plural second main electrode regions arranged in windows of the plurality of windows in which the gate insulation film is not arranged.

14. The semiconductor device according to claim 6, wherein
the drift region has a third side opposite to the second,
the stopper region is a first stopper region, and
the semiconductor device further comprises:
a second gate interconnection extending on the field insulation film along the second direction and connecting the other end sides of the plurality of gate electrodes together, and
a second stopper region of the second conductivity type formed in the drift region, disposed on the third side of the drift region such that the drift region is interposed between the first stopper region and the second stopper region, disposed apart from the second main electrode region, disposed without being positioned between the first main electrode region and the drift region, being under the second gate interconnection apart from the second main electrode region, and having a higher impurity concentration than that of the drift region.

15. A semiconductor device comprising:
a channel-forming region of a first conductivity type;
a first main electrode region of a second conductivity type disposed in a part of an upper part of the channel-forming region;
a drift region of the second conductivity type disposed in an upper part of the channel-forming region apart from the first main electrode region and being a region through which carriers from the first main electrode region run, the drift region and the channel-forming region forming a pn junction therebetween, the drift region having, in a plan view of the semiconductor device, a first side facing the first main electrode region and a second side substantially perpendicular to the first side;
a second main electrode region of the second conductivity type disposed in a part of an upper part of the drift region and receiving the carriers having run through the drift region from the first main electrode region;
a stopper region of the second conductivity type with higher impurity concentration than that of the drift region, disposed on the second side of the drift region, disposed apart from the first main electrode region, disposed without being positioned between the first main electrode region and the drift region, and obstructing extension of a depletion layer at the pn junction between the channel-forming region and the drift region;
a field insulation film covering an end portion of the drift region;
a gate insulation film provided on a surface of the channel-forming region between the drift region and the first main electrode region;
a gate electrode formed on the gate insulation film; and a surface interconnection, to which is applied a voltage of a same potential as that of a voltage applied to the gate electrode, provided on the field insulation film and disposed above and over the stopper region.

16. The semiconductor device according to claim 15, wherein
the surface interconnection is a portion of a gate interconnection included in the semiconductor device, and
the gate interconnection is electrically connected to the gate electrode and to another gate electrode included in the semiconductor device.

* * * * *